(12) United States Patent
Hampp

(10) Patent No.: US 8,643,126 B2
(45) Date of Patent: Feb. 4, 2014

(54) SELF ALIGNED SILICIDED CONTACTS

(75) Inventor: Roland Hampp, Bad Abbach (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/365,418

(22) Filed: Feb. 3, 2012

(65) Prior Publication Data

US 2012/0126343 A1    May 24, 2012

Related U.S. Application Data

(62) Division of application No. 12/040,409, filed on Feb. 29, 2008, now Pat. No. 8,159,038.

(51) Int. Cl.
*H01L 29/78* (2006.01)

(52) U.S. Cl.
USPC .................... 257/412; 257/413; 257/E21.622

(58) Field of Classification Search
USPC ................................................ 257/412, 413
See application file for complete search history.

(56) References Cited

U.S. PATENT DOCUMENTS

| | | |
|---|---|---|
| 4,374,700 A | 2/1983 | Scott et al. |
| 4,476,482 A | 10/1984 | Scott et al. |
| 4,521,952 A | 6/1985 | Riseman |
| 4,818,723 A | 4/1989 | Yen |
| 4,962,414 A | 10/1990 | Liou et al. |
| 5,645,887 A | 7/1997 | Byun |
| 5,757,045 A | 5/1998 | Tsai et al. |
| 5,994,775 A | 11/1999 | Zhao et al. |
| 6,159,844 A | 12/2000 | Bothra |
| 6,323,130 B1 | 11/2001 | Brodsky et al. |
| 6,339,003 B1 | 1/2002 | Kim |
| 6,351,005 B1 | 2/2002 | Al-Shareef et al. |
| 6,432,817 B1 | 8/2002 | Bertrand et al. |
| 7,018,781 B2 | 3/2006 | Fröhlich et al. |
| 2006/0284317 A1 | 12/2006 | Ito et al. |
| 2007/0138523 A1 | 6/2007 | Popp et al. |

*Primary Examiner* — Eva Yan Montalvo
(74) *Attorney, Agent, or Firm* — Slater & Matsil, L.L.P.

(57) ABSTRACT

Structures and methods of forming self aligned silicided contacts are disclosed. The structure includes a gate electrode disposed over an active area, a liner disposed over the gate electrode and at least a portion of the active area, an insulating layer disposed over the liner. A first contact plug is disposed in the insulating layer and the liner, the first contact plug disposed above and in contact with a portion of the active area, the first contact plug including a first conductive material. A second contact plug is disposed in the insulating layer and the liner, the second contact plug disposed above and in contact with a portion of the gate electrode, the second contact plug includes the first conductive material. A contact material layer is disposed in the active region, the contact material layer disposed under the first contact plug and includes the first conductive material.

26 Claims, 32 Drawing Sheets

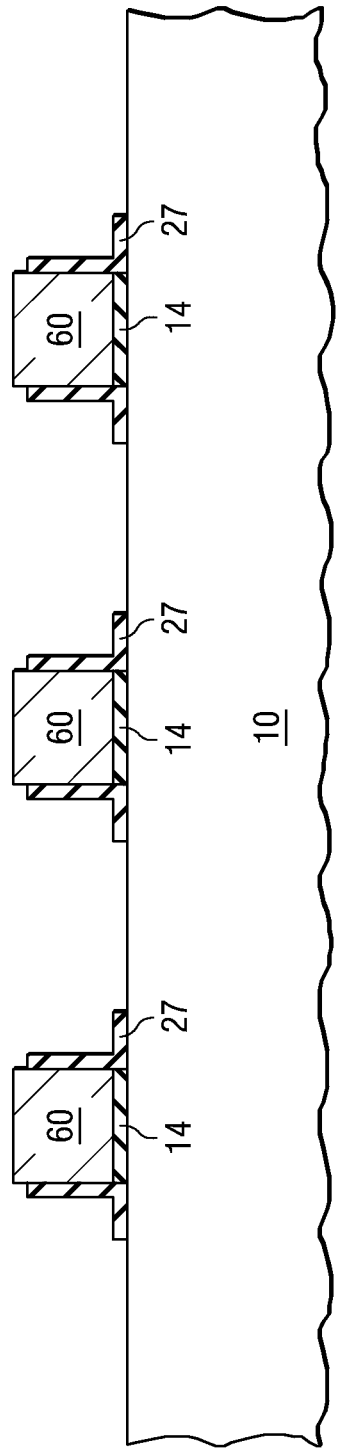
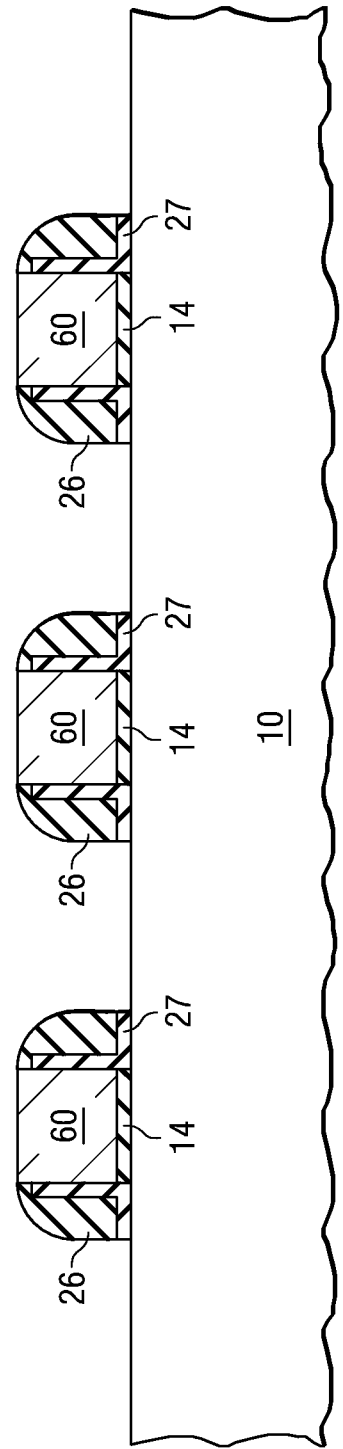
FIG. 5a
FIG. 5b

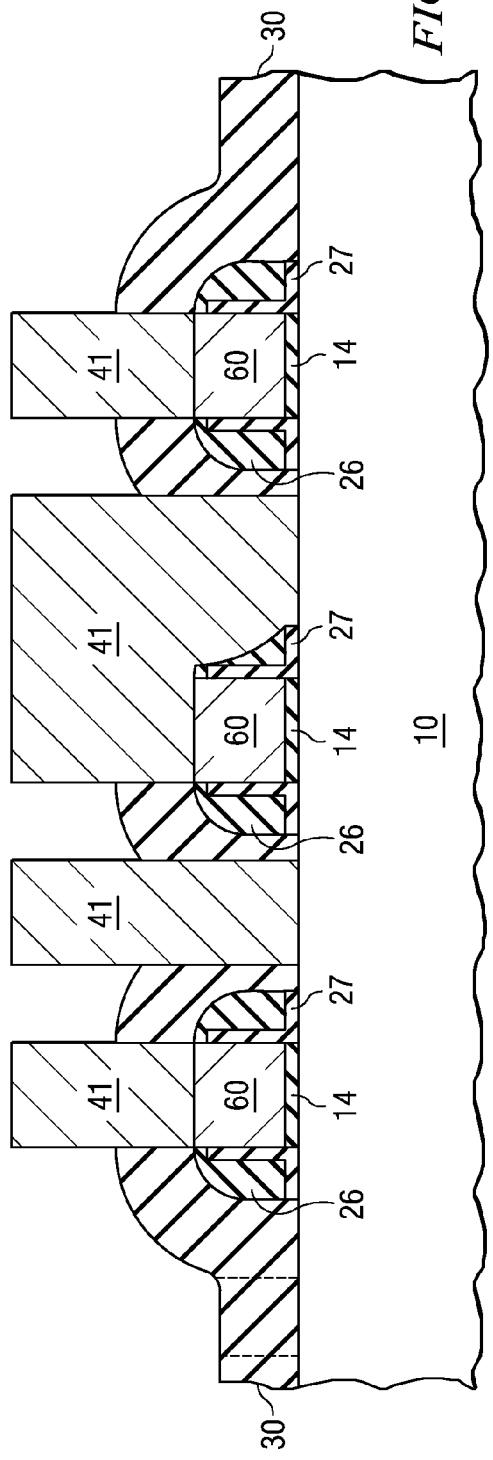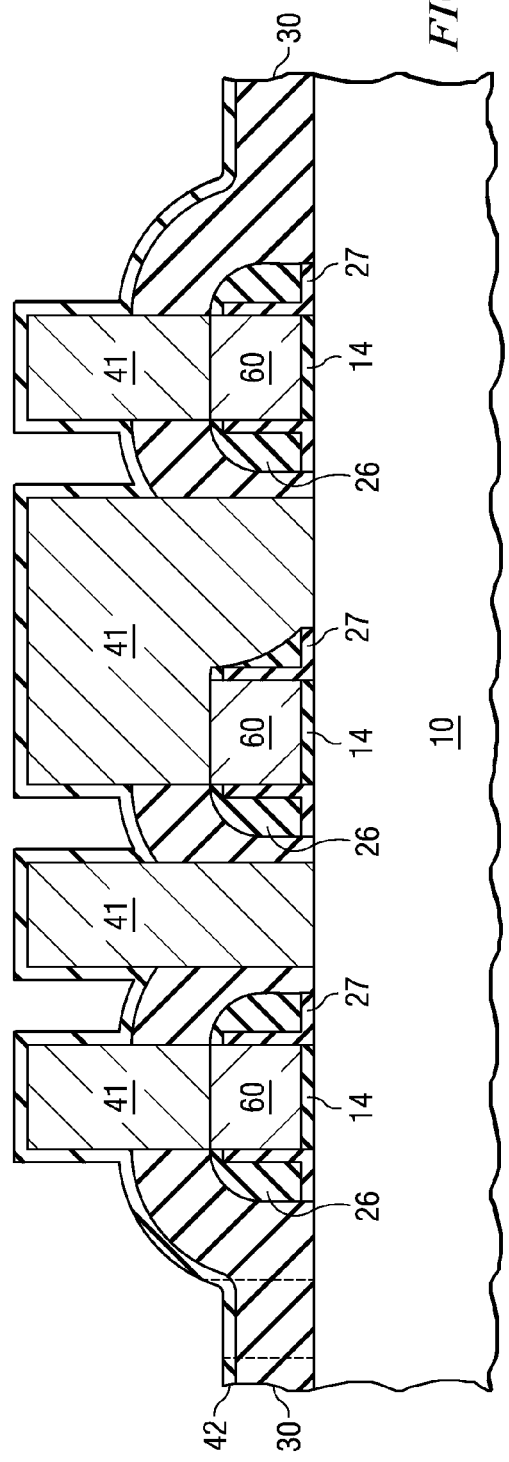

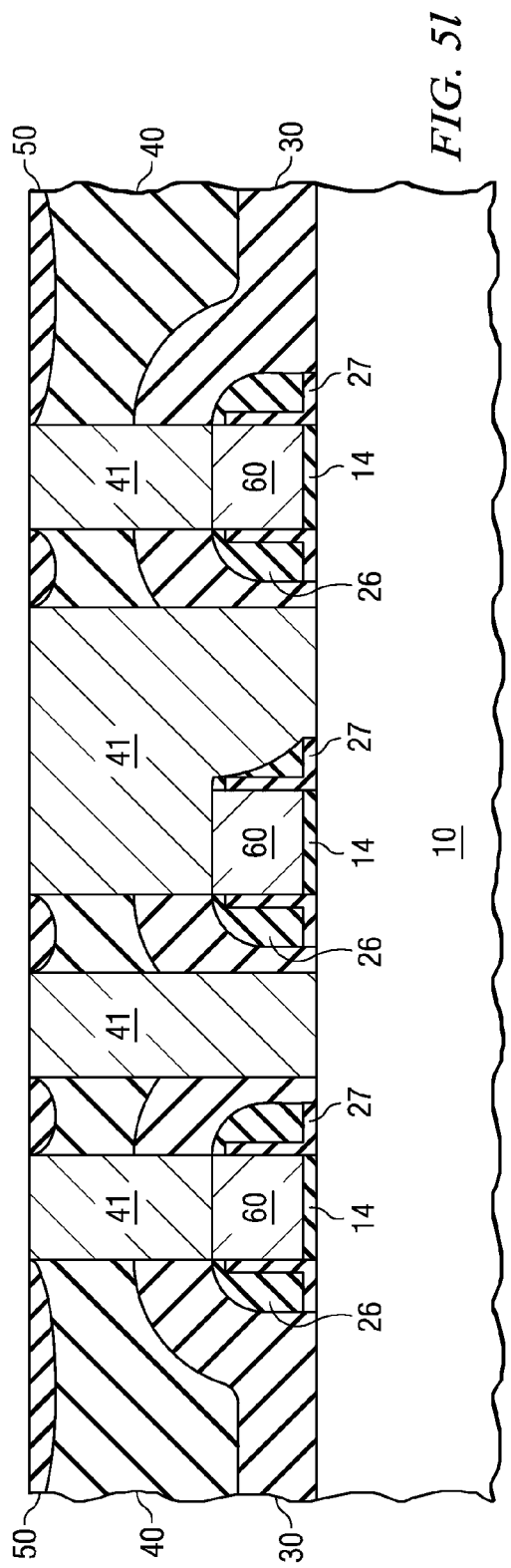
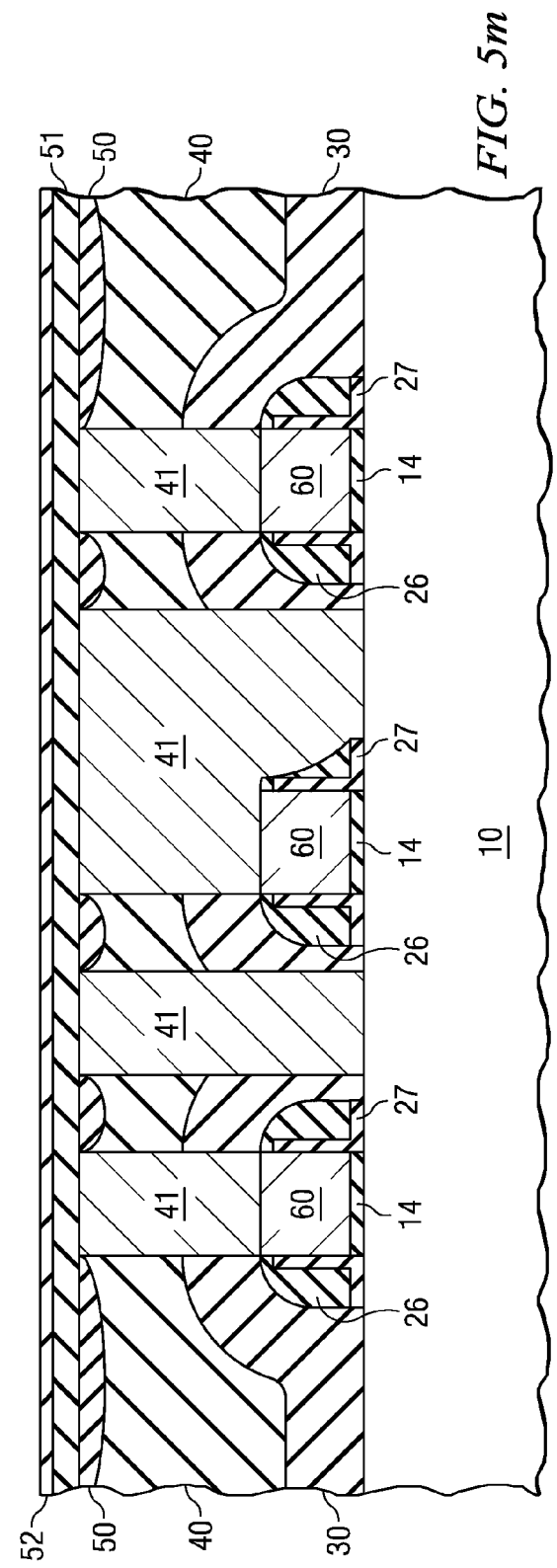

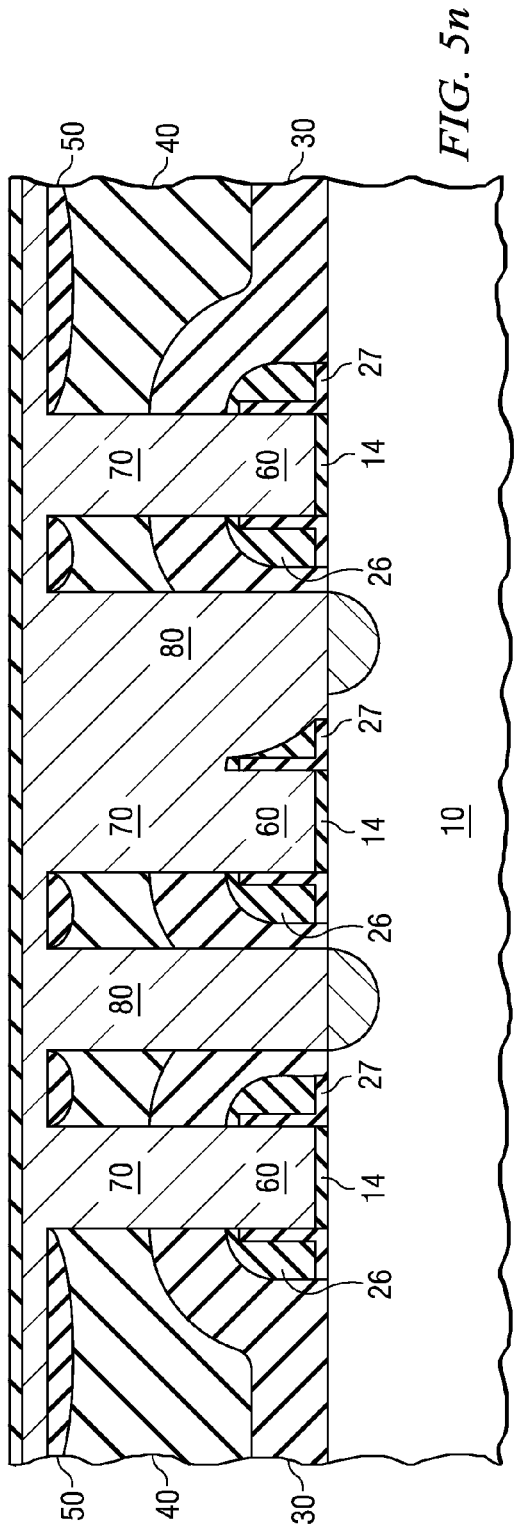
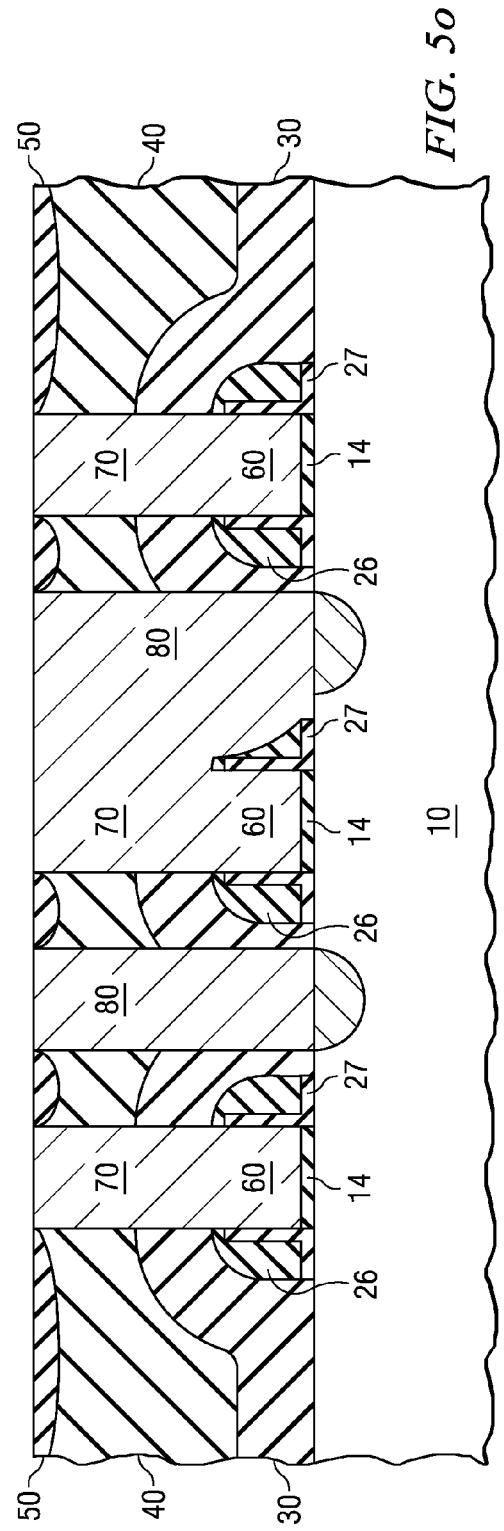

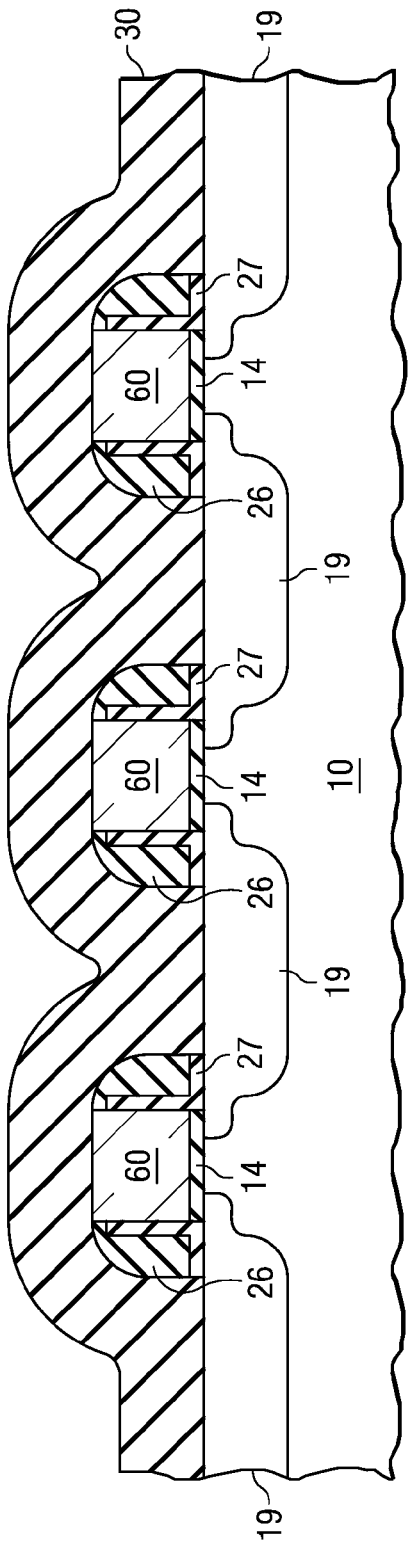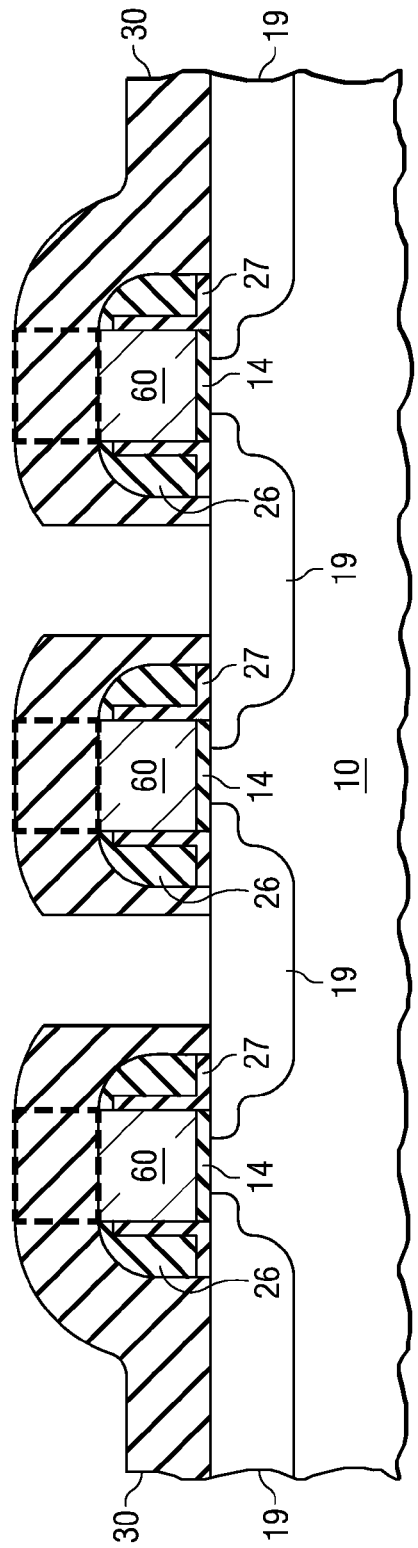
FIG. 7a
FIG. 7b

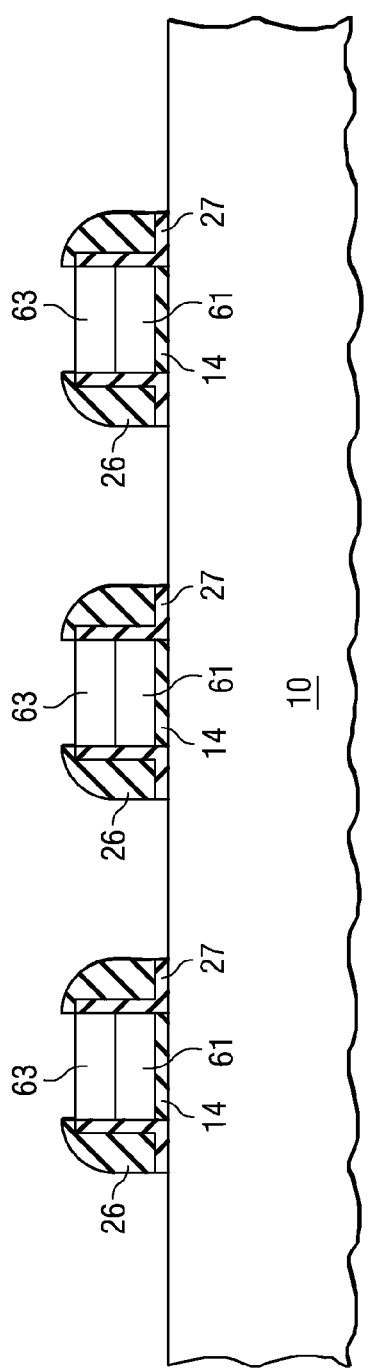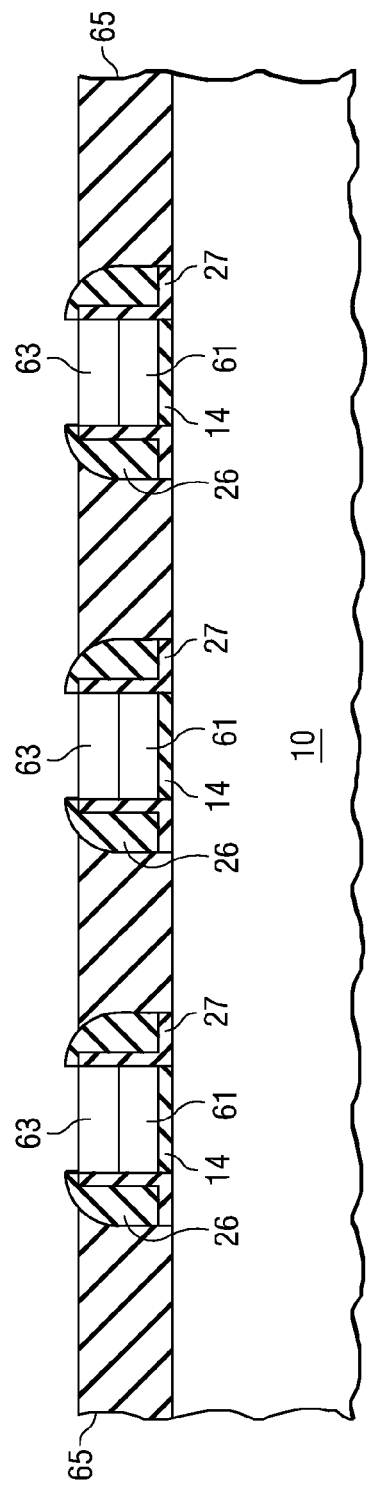

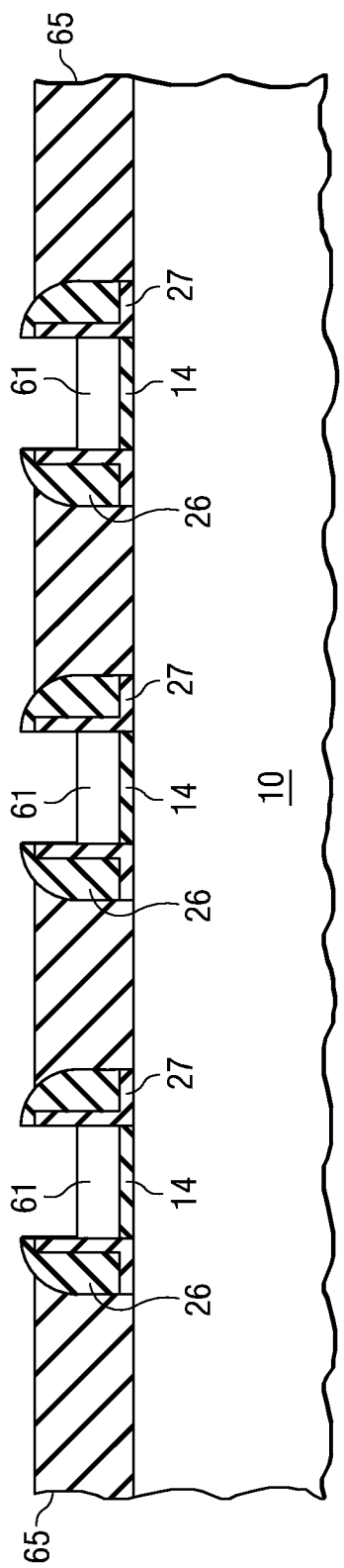
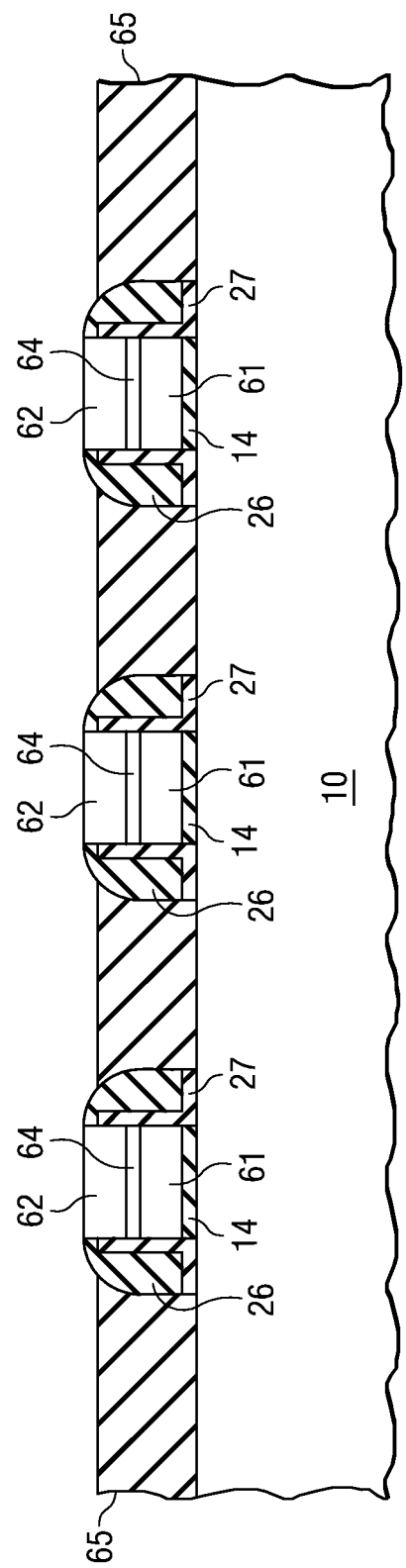
FIG. 9c
FIG. 9d

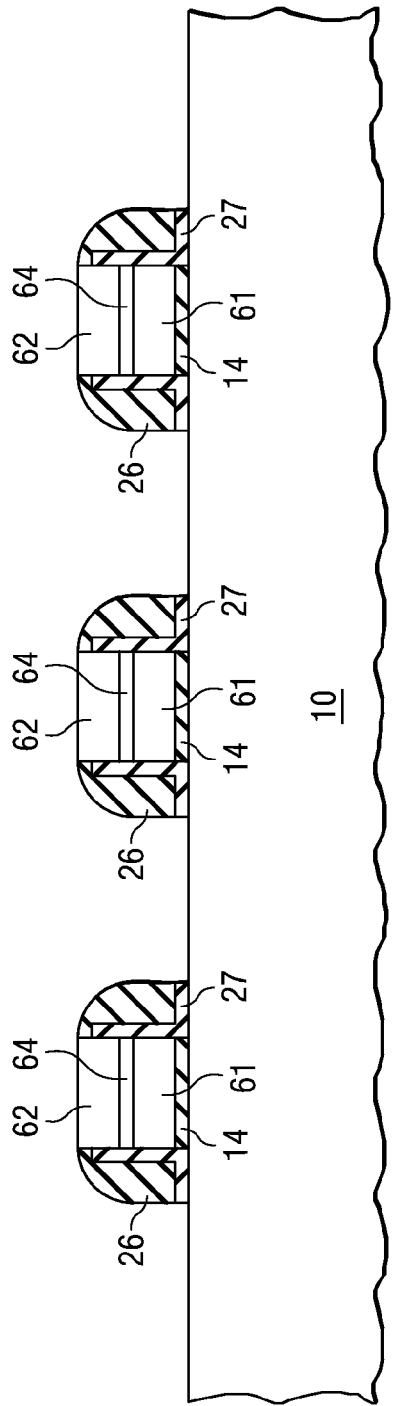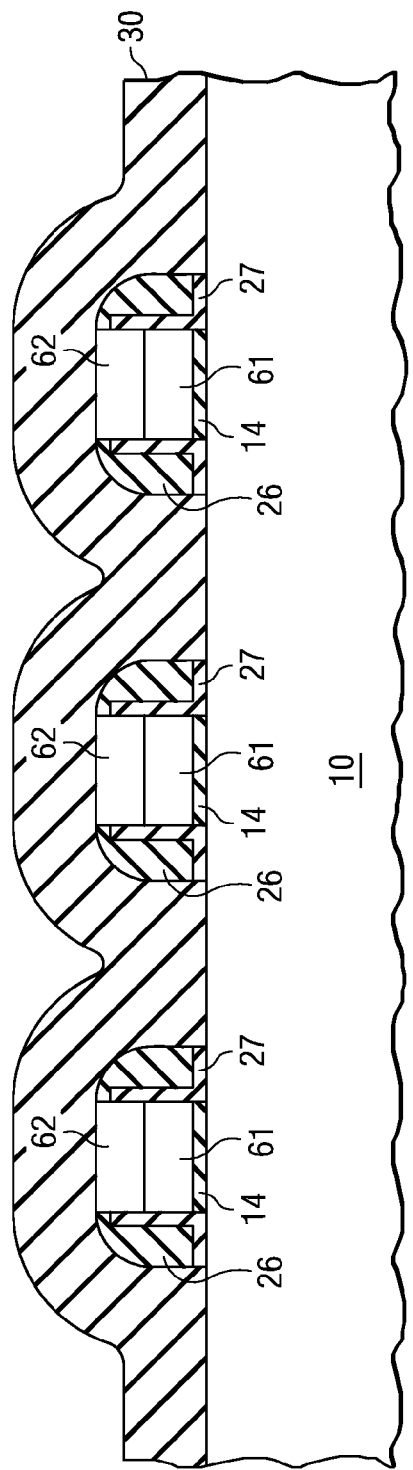

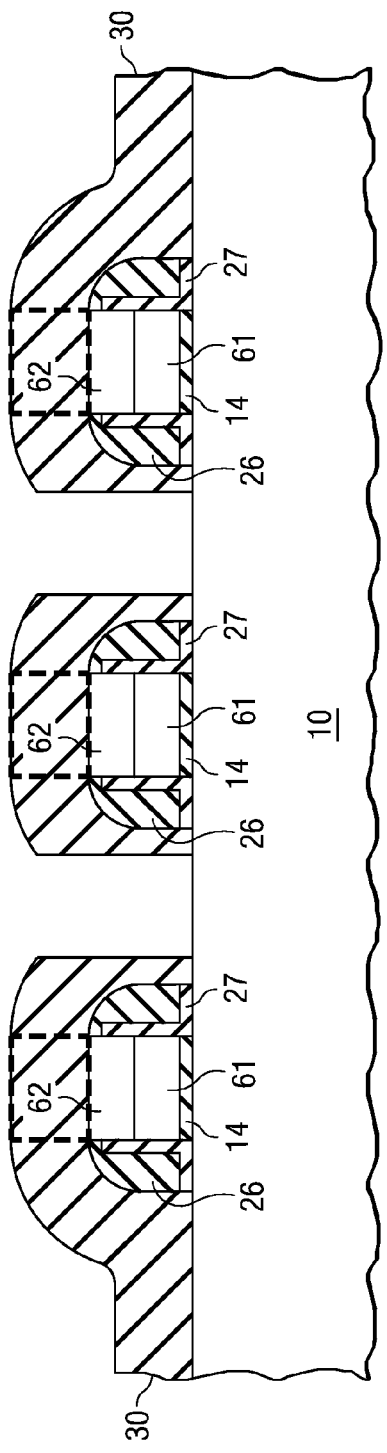
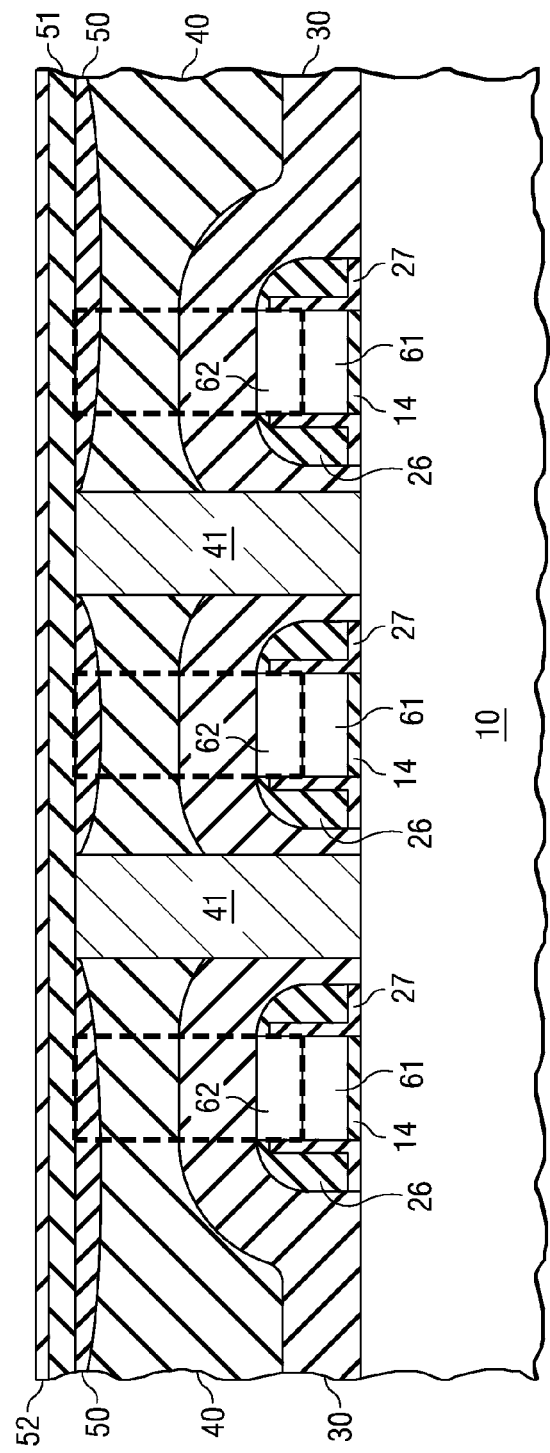
FIG. 9g
FIG. 9h

SELF ALIGNED SILICIDED CONTACTS

This is a divisional application of U.S. application Ser. No. 12/040,409, which was filed on Feb. 29, 2008 and is incorporated herein by reference.

TECHNICAL FIELD

This invention relates generally to electronic devices and, in particular embodiments, to self aligned silicided contacts.

BACKGROUND

Semiconductor devices are used in many electronic and other applications. Semiconductor devices comprise integrated circuits that are formed on semiconductor wafers by depositing many types of thin films of material over the semiconductor wafers, and patterning the thin films of material to form the integrated circuits.

There is a trend in the semiconductor industry towards reducing the size of features, e.g., the circuits, elements, conductive lines, and vias of semiconductor devices, in order to increase performance of the semiconductor devices, minimize current leakage and reduce power consumption, for example. The minimum feature size of semiconductor devices has steadily decreased over time. However, as features of semiconductor devices become smaller, it becomes more difficult to pattern the various material layers because of diffraction and other effects that occur during a lithography process. For example, key metrics such as resolution and depth of focus of the imaging systems may suffer when patterning features at small dimensions. One such challenge involves the contact formation in the front-end-of-line that includes silicidation of active area and forming contacts to it through an insulating layer. Scaling challenges these processes by decreasing the contact sizes as well as the contact to contact spacing. Increasingly silicidation introduces defects that significantly reduce process yields.

Innovative process solutions have been developed that overcome some of these limitations. However, many such process solutions also interact with subsequent steps and may degrade other equally important factors.

Thus, what are needed in the art are structures and methods of forming semiconductor devices that minimize process complexity and costs but enable continued scaling.

SUMMARY OF THE INVENTION

These and other problems are generally solved or circumvented, and technical advantages are generally achieved, by embodiments of the present invention.

Embodiments of the invention include methods and structure for forming self aligned silicided contacts. The semiconductor device comprises an active area disposed in a semiconductor body, a gate electrode disposed over the active area, a liner disposed over the gate electrode and at least a portion of the active area, an insulating layer disposed over the liner. A first contact plug is disposed in the insulating layer and the liner, the first contact plug disposed above, and in contact with, a portion of the active area, the first contact plug comprises a first conductive material. A second contact plug is disposed in the insulating layer and the liner, the second contact plug disposed above, and in contact with, a portion of the gate electrode, the second contact plug comprises the first conductive material. The structure further comprises a contact material layer disposed in the active region. The contact material layer is disposed under the first contact plug, the contact material layer comprising the first conductive material.

The foregoing has outlined rather broadly an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes FIGS. 1a-1d, illustrate schematics of devices fabricated in accordance with embodiments of the invention, wherein FIG. 1a illustrates a cross sectional view of the devices and FIGS. 1b-1d illustrate a top view of the devices illustrated in FIG. 1a;

FIG. 2, which includes FIGS. 2a and 2b, illustrates schematics of devices fabricated in accordance with embodiments of the invention, wherein FIG. 2a illustrates a cross sectional view of the devices and FIG. 2b illustrates a top view of the devices illustrated in FIG. 2a;

FIG. 3, which includes FIGS. 3a and 3b, illustrates schematics of devices fabricated in accordance with embodiments of the invention, wherein FIG. 3a illustrates a cross sectional view of the devices and FIG. 3b illustrate a top view of the devices illustrated in FIG. 3a;

FIG. 4, which includes FIGS. 4a and 4b, illustrates schematics of devices fabricated in accordance with embodiments of the invention, wherein FIG. 4a illustrates a cross sectional view of the devices and FIG. 4b illustrate a top view of the devices illustrated in FIG. 4a;

FIG. 7, which includes FIGS. 7a-7d, illustrates a method for fabrication of a semiconductor chip in various stages of processing, in accordance with embodiments of the invention;

FIG. 9, which includes FIGS. 9a-9i, illustrates a method for fabrication of a semiconductor chip in various stages of processing, in accordance with embodiments of the invention;

FIG. 11, which includes FIGS. 11a-11c, illustrate schematics of devices fabricated in accordance with embodiments of the invention, wherein FIG. 11a illustrates a cross sectional view of the devices, FIGS. 11b-11c illustrate a top view of the devices illustrated in FIG. 11a.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1A:
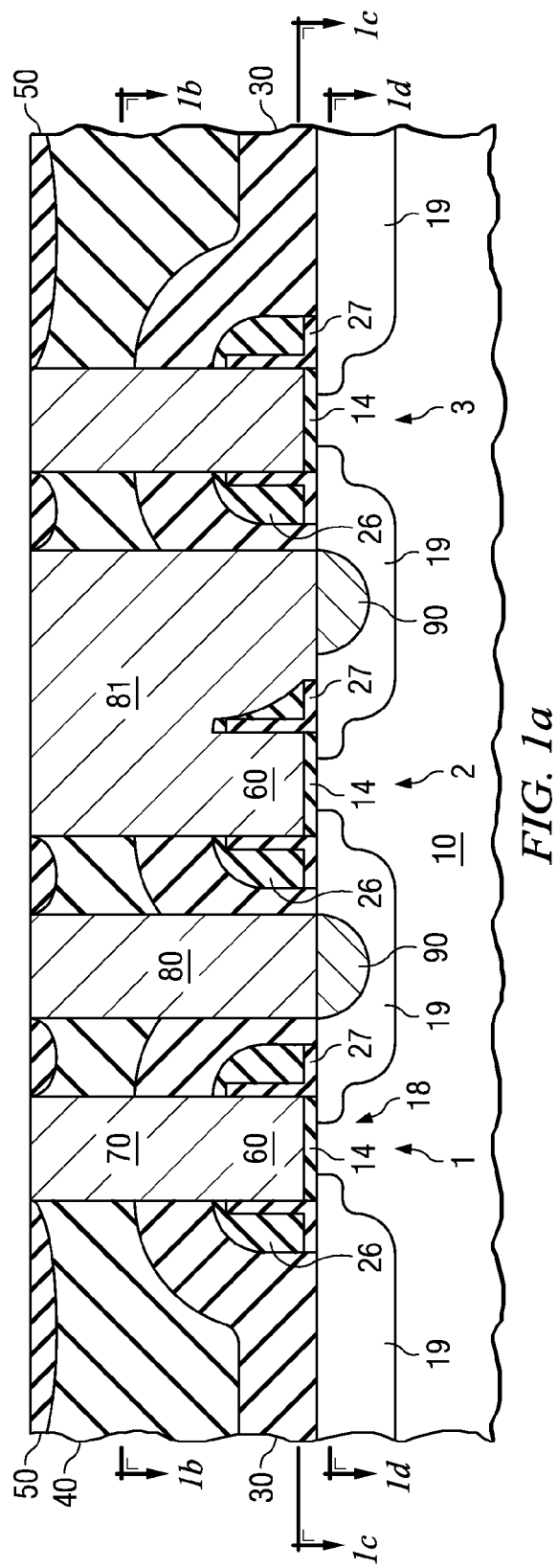

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a structure and method for forming semiconductor devices with self aligned silicided contacts. In various embodiments, the invention avoids the problems arising from patterning contacts in small dimensions. Contacts are patterned in conventional technology by patterning an insulating layer overlying the active regions of the device. The patterned insulating layer is subsequently filled with a metal. However, increasingly due to decrease in dimensions of contacts, as well decrease in contact to contact spacing, contact patterning poses significant challenges for the lithography tool as well as for the metal fill tools. Further, all the top surface of the source/drain regions and the gate electrodes are silicided to ensure good electrical contact when the contact plugs land on the active area or the gate electrodes. However, this adds additional complexity to the process, and reduces process margin due to formation of defects during silicidation of large surfaces of the active area.

In various embodiments, the present invention overcomes these limitations by an inverse contact patterning process. The process forms self aligned silicide on the active region along with the contacts in a single step reducing significant complexity. Consequently, only regions immediately underneath the contact plugs are silicided, ensuring an automated self aligned silicide-contact plug structure. Using such an approach, the silicide material can be independently tailored. For example, if the volume of the silicided regions can thus be reduced without a significant penalty on the device contact resistance, many problems associated with silicide formation can be avoided. As an example, yield detractors such as silicide pipes or shorts as well shorts along the isolation sidewall can be minimized. Finally, by using a silicidation process to form the contact plugs, the complexity of filling high aspect ratio plugs is avoided.

A structural embodiment of the invention will be first described using FIG. 1. Further, structural embodiments are next described in FIGS. 2-4 and 11. Embodiments of the methods of fabrication will be described using FIGS. 5, 7 and 9 and the flow charts of FIGS. 6, 8 and 10.

An embodiment of the invention is illustrated in FIG. 1 which includes FIGS. 1a-1d. FIG. 1 illustrates a device fabricated in accordance with an embodiment of the present invention. In this embodiment, the gate electrode, the contact plugs connecting the gate electrode and the source/drain regions, and the source/drain silicide underlying the contact plugs comprise a metal silicide.

Referring to FIG. 1a, a first, second, and third transistors 1, 2, and 3 includes a channel region 18 disposed in the semiconductor body 10. A gate dielectric 14 overlies the channel region 18 and a gate electrode 60 overlies the gate dielectric 14. The gate electrode 60 comprises a fully silicided material. Source/drain regions 19 comprising source/drain extensions and deep source/drain regions are disposed in the semiconductor body 10 and spaced from each other by the channel region 18. The deep source/drain regions connect to the source/drain extension regions. The first, second and third transistors 1, 2 and 3 also include first and second spacers 26 and 27 used in the formation of the source/drain regions 19. An etch stop liner 30 overlies the source/drain regions 19, the first and second spacers 26 and 27. In preferred embodiments, the etch stop liner 30 imparts a strain in the channel. In one example, the etch stop liner 30 is a tensile stress liner and the source/drain regions 19 are n+ regions (and the transistor is therefore an n-channel transistor). In another example, the etch stop liner 30 is a compressive stress layer and p+ source/drain regions 19 form a p-channel transistor.

An interlayer dielectric (ILD) 40 covers the etch stop liner 30. Source/drain electrodes 80 are formed through contact holes in the ILD 40 and comprise a silicide material. Silicide regions 90 are formed in the source/drain regions 19 locally around the source/drain electrodes 80 formed in the ILD 40 and the etch stop liner 30. In various embodiments, the silicide region 90 comprises a thickness of about 5 nm to about 30 nm. In some embodiments, the silicide regions 90 comprise germanium and/or germanides.

Gate plugs 70 are formed through contact holes in the ILD 40 and comprise a silicide material. In various embodiments, the gate plugs 70 and source/drain electrodes 80 comprise materials selected from the group consisting of nickel silicide, platinum silicide, nickel germanide, platinum germanide, yerbium silicide, yerbium germanide, erbium silicide, erbium germanide, cobalt silicide, titanium silicide, tantalum silicide, molybdenum, tungsten and combinations thereof. A cap liner 50 (optional) is disposed above the ILD 40. Subsequent layers of metallization (not shown) are disposed above the ILD 40 (or cap liner 50).

Second transistor 2 comprises a contact bar 81 which comprises combined gate plugs 70 and source/drain electrodes 80. The source/drain region of the second transistor 2 is shorted to the gate contact via the contact bar 81.

Figure 1B:
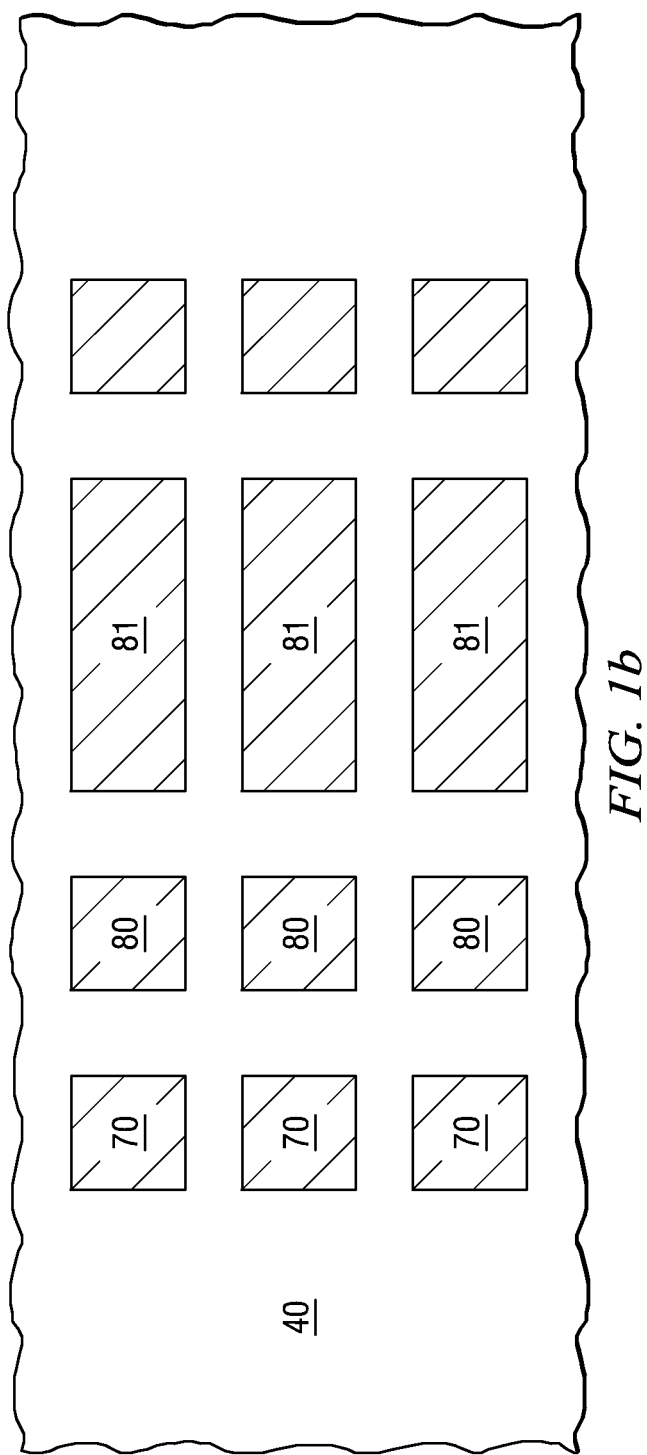
Figure 1C:
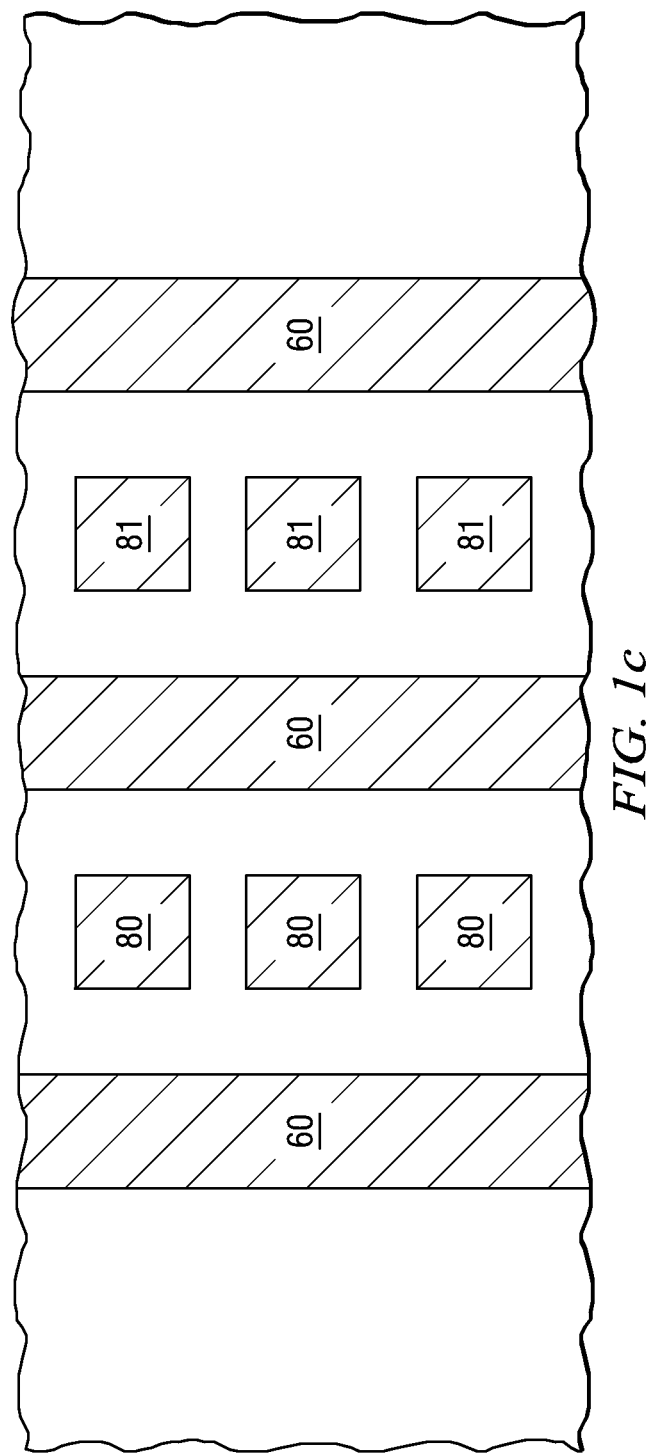
Figure 1D:
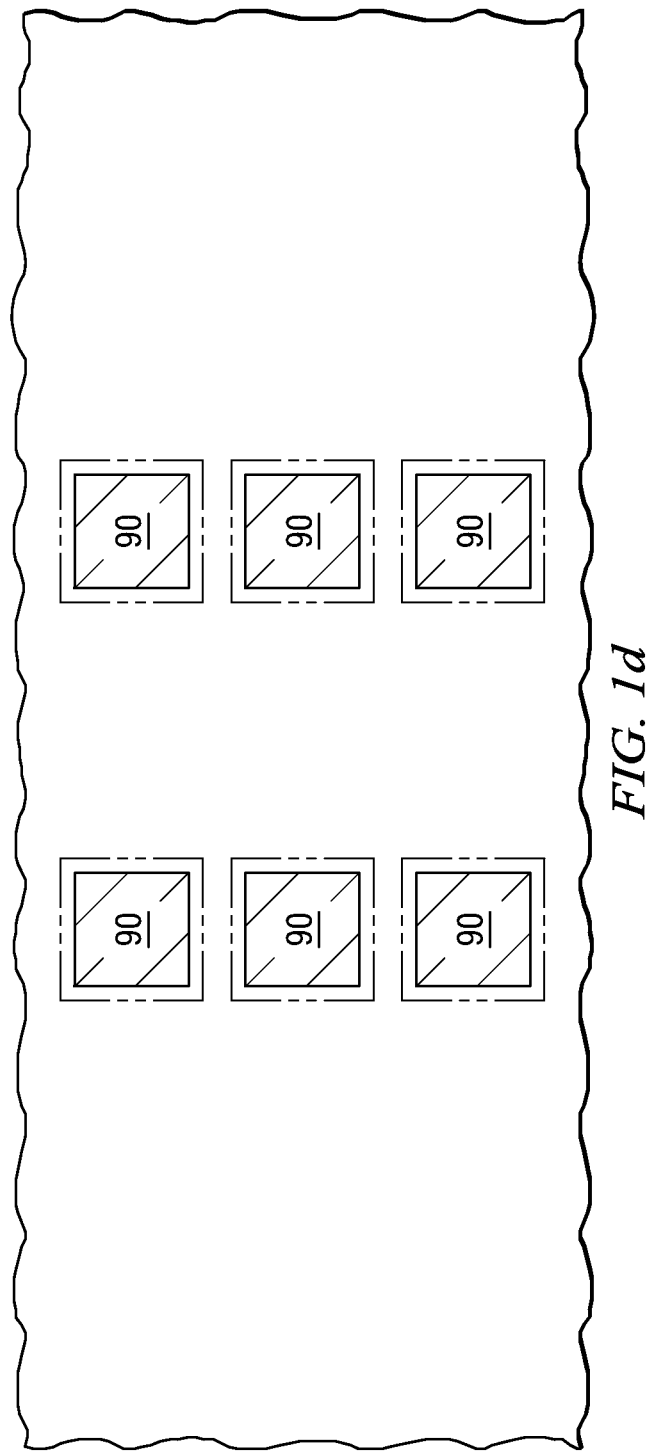

FIG. 1b illustrates a top cross section (cut line 1b) of FIG. 1a. The gate plugs 70 and source/drain electrodes 80 are disposed in the ILD 40. In various embodiments, the size of the gate plugs 70 and the source/drain electrodes 80 may be different. For example, in some embodiments, the gate plugs 70 may comprise narrow but more number of contacts to minimize variations in the degree of silicide formed over the gate oxide 15 along the device width. FIG. 1c illustrates a top view cross section (cut line 1c) of FIG. 1a. The source/drain electrodes 80 are disposed between the gate electrode 60. FIG. 1d illustrates a top cross section (cut line 1d of FIG. 1a) of the upper surface of the semiconductor body 10. The silicide regions 90 are formed only under the source/drain electrodes 80 in the source/drain regions 19. The top view of the source/drain electrodes 80 on the source/drain regions 19 may be of any suitable shape. In the present embodiment, a square contact hole 70 is shown. In other examples, it may also be a triangle, a quadrilateral (such as a square, a diamond, a rectangle, or a trapezoid), an oval, an ellipse, any other polygon or any non linear shape. Similarly, the embodiment shows three contacts made onto the active source/drain regions 19. However, any suitable number of contacts can be present.

Although the gate electrode 60 comprises a fully silicided gate material, in some embodiments, the gate electrode 60 comprises a first conductive material that permits the in-diffusion of a metal. The diffused metal significantly altering the electrical properties of the first conductive material. For example, the first conductive material in one embodiment comprises a first metal, the first metal intermixes with a second metal forming a new alloy with significantly different work function. Preferably, the new alloy comprises a work function closer to the band edges of silicon. In another embodiment, the first conductive material comprises a metal nitride which is doped by a second metal. The metal nitride doped with the second metal comprises a work function significantly different from an un-doped metal nitride. Preferably, the metal nitride doped with the second metal comprises a work function closer to the band edges of silicon.

Figure 2A:
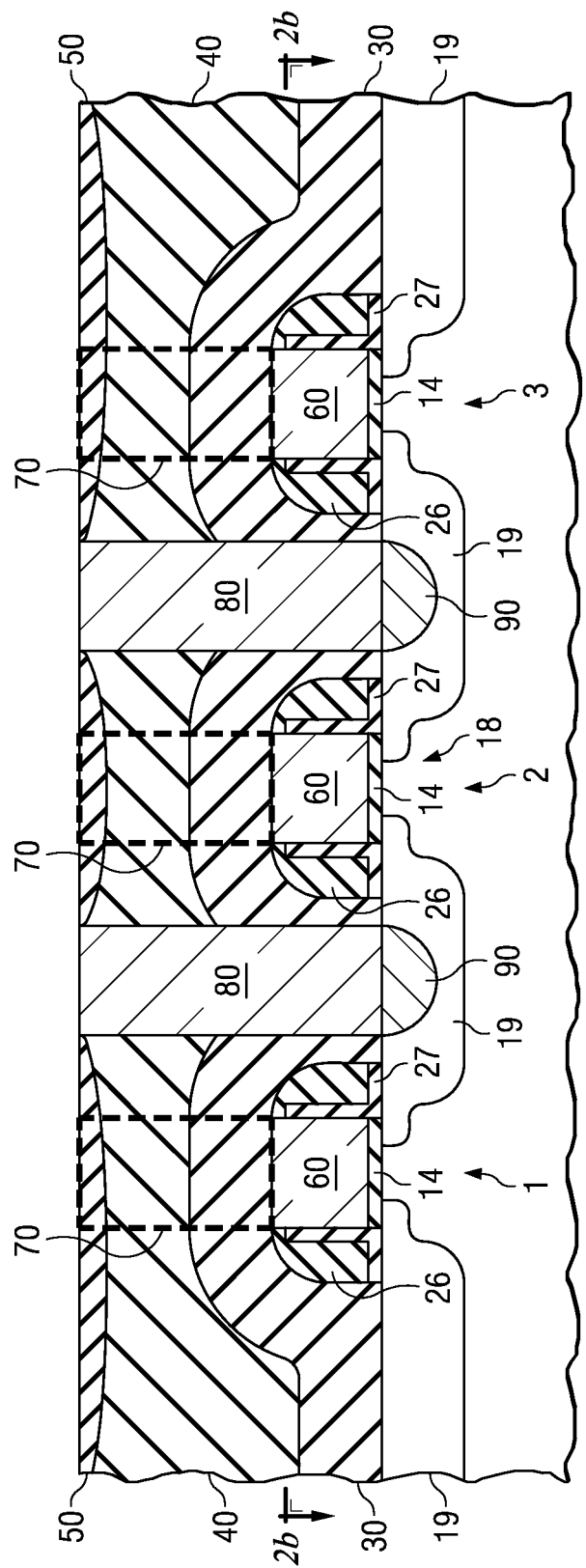
Figure 2B:
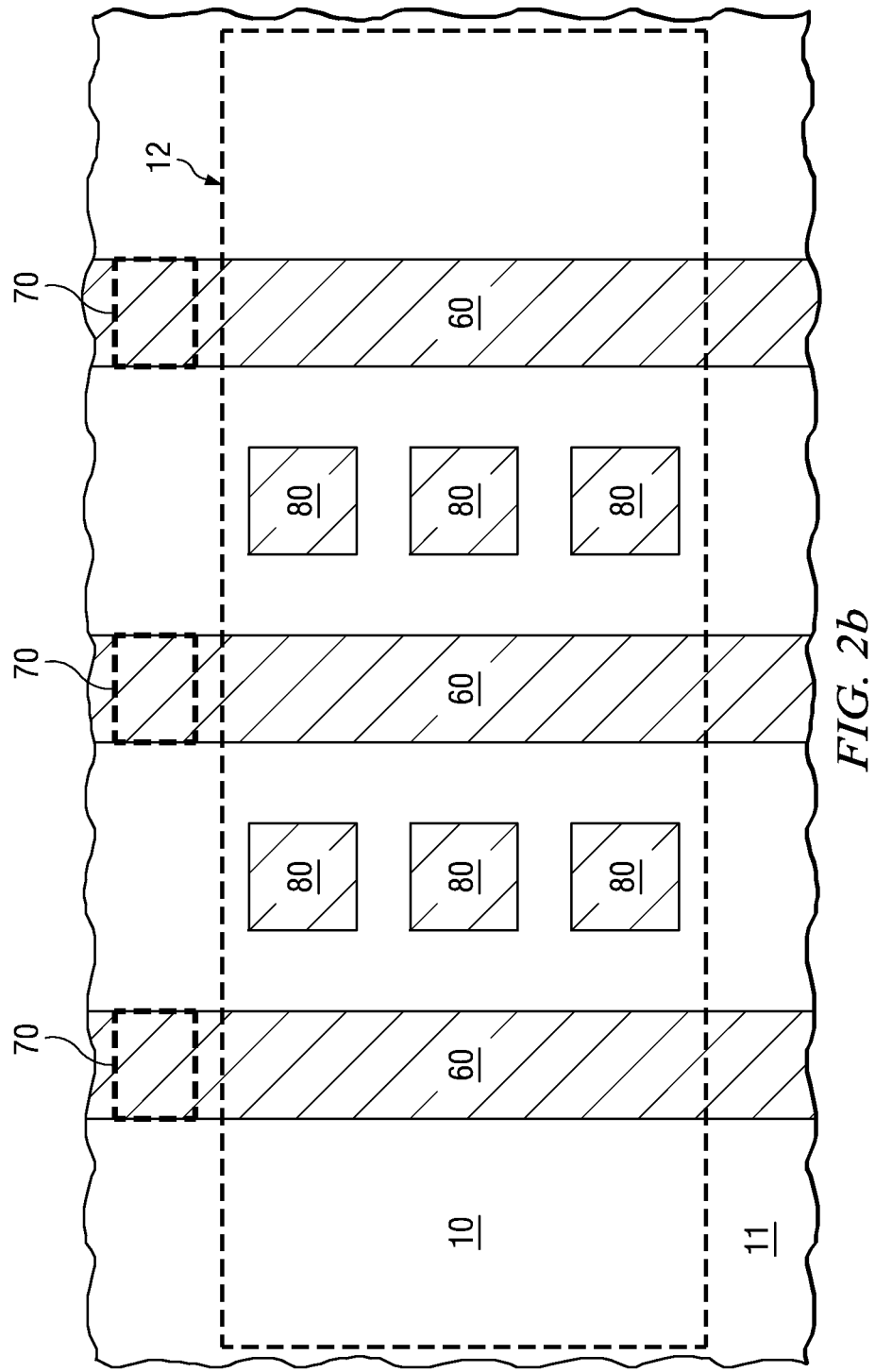

A structural embodiment of a device fabricated with a silicide liner is illustrated in FIG. 2 which includes FIGS. 2a and 2b. In this embodiment, the portion of the gate electrode 60 immediately adjacent the gate dielectric 24 and vertically overlying the channel 18 is not silicided. The gate plugs 70 (shown by dashed lines as they are out of plane) are formed through contact holes in the ILD 40 and comprise a silicide material. Source/drain electrodes 80 are formed through contact holes in the ILD 40 and comprise a silicide material. Silicide regions 90 are formed in the source/drain regions 19 locally around the source/drain electrodes 80 formed in the ILD 40 and the etch stop liner 30. A cap liner 50 (optional) is disposed above the ILD 40. The gate electrode 60 unlike the previous embodiment is not fully silicided. In FIG. 2b, the active region 12 surrounded by the isolation 11 is illustrated by dashed lines. As illustrated in FIG. 2b, the gate plugs 70 are disposed above the isolation 11 and the gate electrode underlying the gate plugs 70 are silicided. However, the gate electrodes 60 over the semiconductor body 10 and away from the gate plugs 70 are not silicided.

Figure 3A:
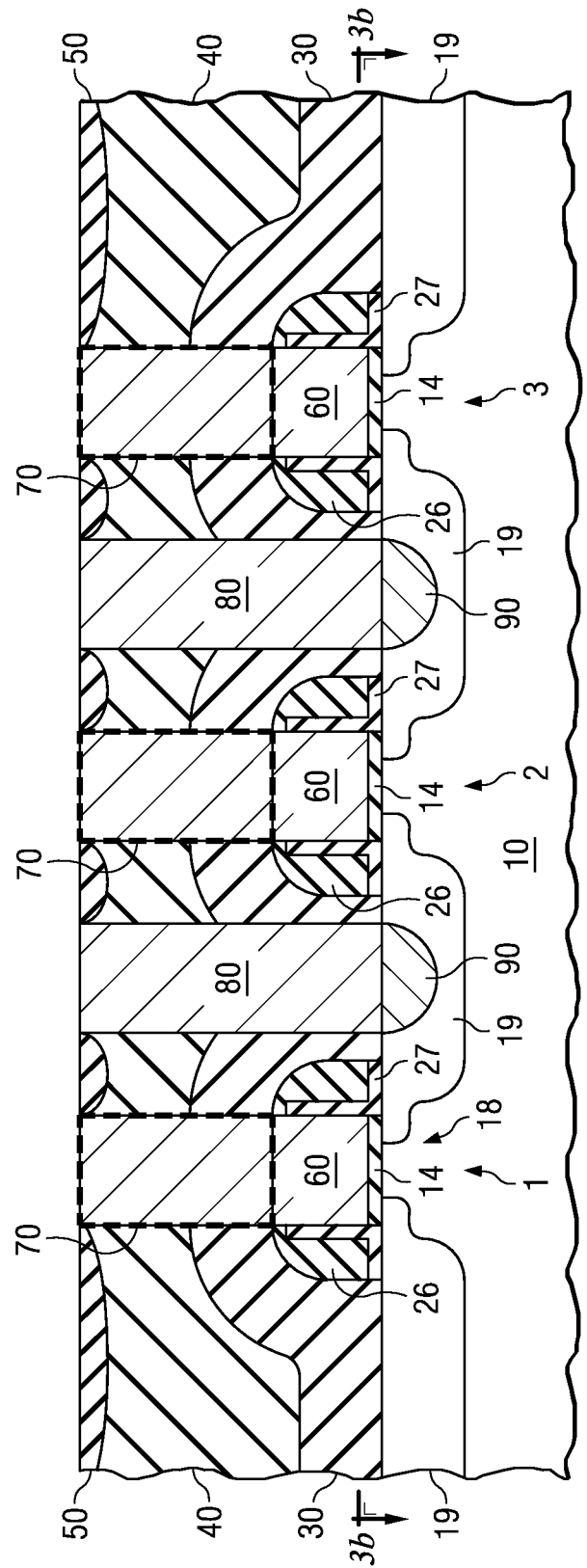
Figure 3B:
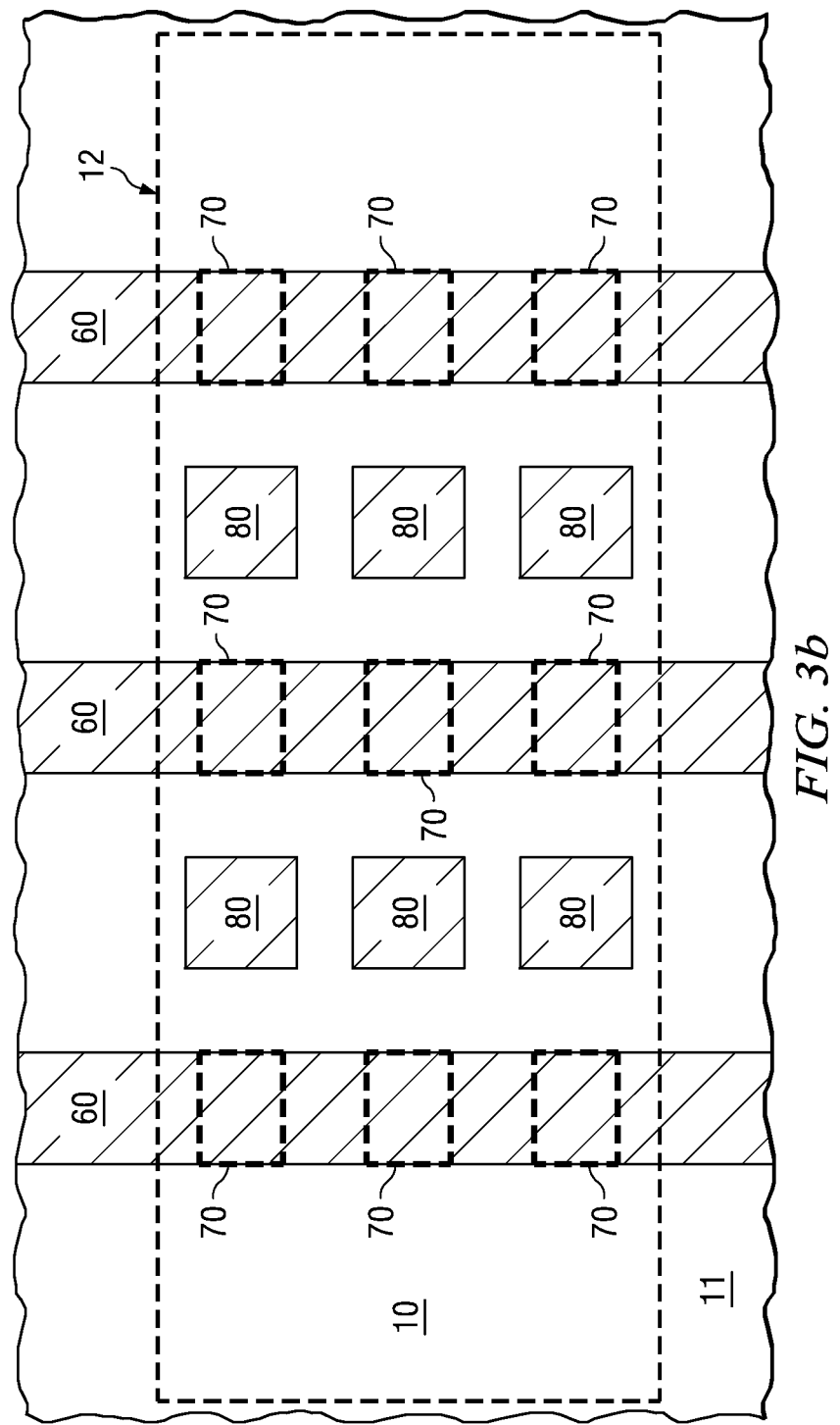

A structural embodiment of a device fabricated with a silicide liner is illustrated in FIG. 3 which includes FIGS. 3a and 3b. In this embodiment, the portion of the gate electrode 60 immediately overlying the channel 18 is not silicided, and comprises a conductive metal. The metal acts as a diffusion barrier for the silicide material. In various embodiments, the gate electrode 60 comprises metal and metal nitrides. Examples include Ti, Ta, TiN, TaN, W, WN, Ni, Pt, Rh. Referring to FIG. 3a, the gate electrode is not silicided and independent of the location of the gate plugs 70. The gate plugs 70 are formed through contact holes in the ILD 40 and the etch stop liner 30 and comprise a silicide material. Source/drain electrodes 80 are formed through contact holes in the ILD 40 and the etch stop liner 30 and comprise a silicide material. Silicide regions 90 are formed in the source/drain regions 19 locally around the source/drain electrodes 80 formed in the ILD 40 and the etch stop liner 30. A cap liner 50 (optional) is disposed above the ILD 40. Although the gate plugs 70 overlie the gate electrode 60, the gate electrode 60 comprises a material that provides a diffusion barrier to the silicide metal. In FIG. 3b, the active region 12 and the isolation 11 are illustrated by dashed lines. In different embodiments, the location of the gate plugs 70 may be either only over the isolation or the active region 12 or both.

Figure 4A:
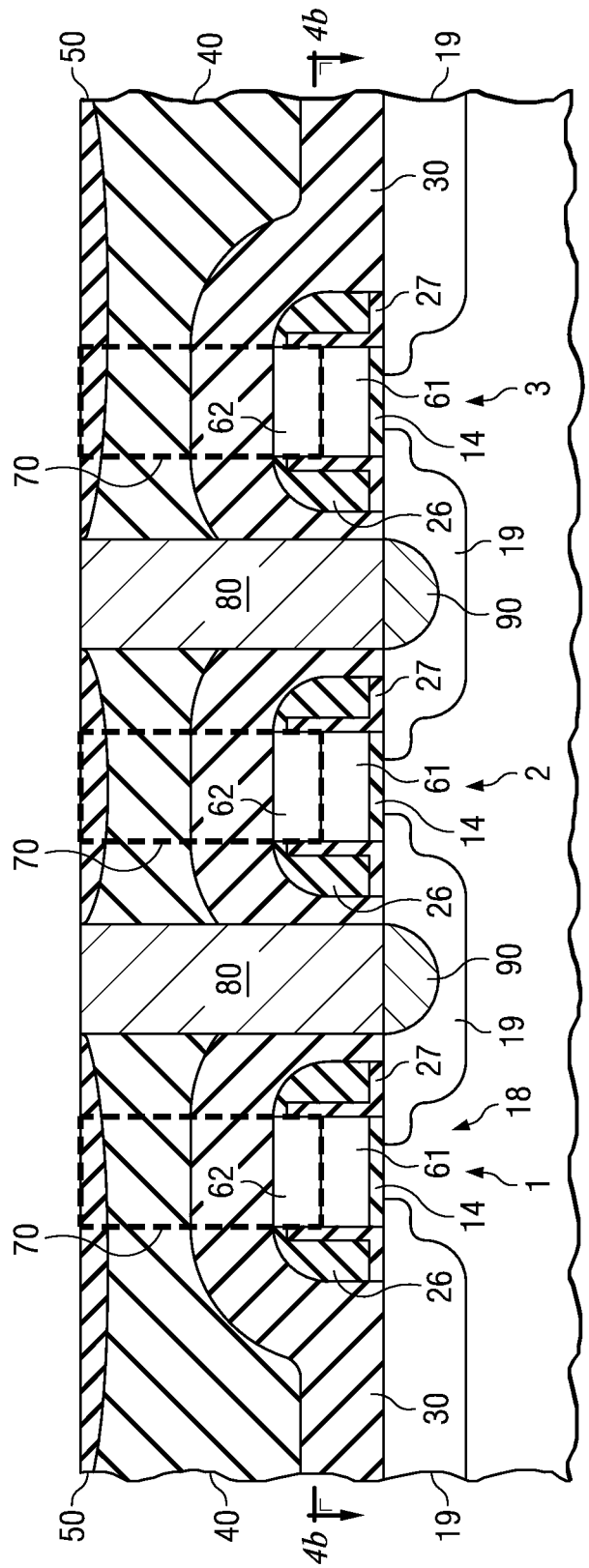
Figure 4B:
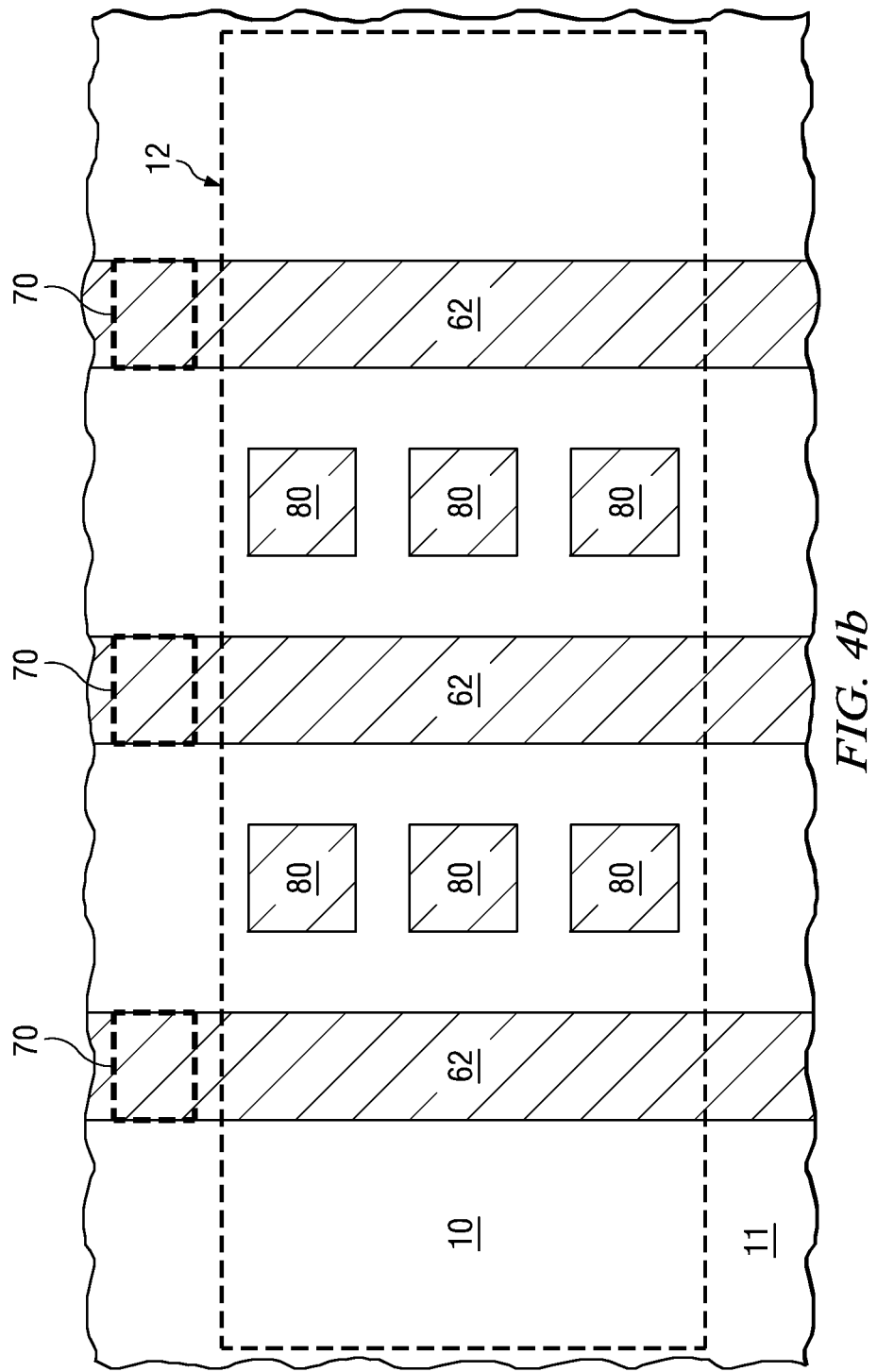

FIG. 4, which includes FIGS. 4a and 4b, illustrates an embodiment in which the gate electrode 60 comprises a multi-layer stack comprising conductive materials. FIG. 4a illustrates a horizontal cross section and FIG. 4b illustrates a top view of a device. Referring to FIG. 4a, the gate electrode 60 comprises a first conductive material 61 overlying a channel region 18. A second conductive material 62 is disposed above the first conductive material 61 forming the gate structure. In some embodiments, the gate electrode 60 comprises more than two conductive layers. The gate plugs 70 (shown by dashed lines as they are out of plane) are formed through contact holes in the ILD 40 and the etch stop liner 30 and comprise a silicide material. Source/drain electrodes 80 are formed through contact holes in the ILD 40 and the etch stop liner 30 and comprise a silicide material. Silicide regions 90 are formed in the source/drain regions 19 locally around the source/drain electrodes 80 formed in the ILD 40 and the etch stop liner 30. A cap liner 50 (optional) is disposed above the ILD 40. Referring to FIG. 4b, the gate plugs 70 are disposed above the isolation 11. However, as in the embodiment illustrated in FIG. 3b, the gate plugs 70 may be disposed directly above the channel region 18 or both.

Embodiments of the methods of fabrication will now be described using FIGS. 5, 7, 9 and 10 and the flow charts of FIGS. 6, 8 and 10.

A method of fabrication of the structure will now be described using FIG. 5 and the flow chart of FIG. 6, in accordance with an embodiment of the invention, wherein FIGS. 5a-5l illustrate cross sectional views of a portion of the wafer during the fabrication process.

FIG. 5a illustrates the device after formation of gate stacks in a semiconductor fabrication process. Referring to FIG. 5a, the semiconductor body 10 is a silicon wafer. Some examples of the semiconductor body 10 are a bulk mono-crystalline silicon substrate (or a layer grown thereon or otherwise formed therein), a layer of {110} silicon on a {100} silicon wafer, a layer of a silicon-on-insulator (SOI) wafer, or a layer of a germanium-on-insulator (GeOI) wafer. In other embodiments, other semiconductors such as silicon germanium, germanium, gallium arsenide, indium arsenide, indium gallium arsenide, indium antimonide, or others can be used with the wafer.

In this embodiment, isolation regions comprising a shallow trench isolation (not shown) are formed in the semiconductor body 10 to separate the active regions of the semiconductor body 10. As also shown in FIG. 2a, the gate stack is formed. A gate dielectric 14 is deposited over exposed portions of the semiconductor body 10. In one embodiment, the gate dielectric 14 comprises an oxide (e.g., $SiO_2$), a nitride (e.g., $Si_3N_4$), or a combination of oxide and nitride (e.g., SiON, or an oxide-nitride-oxide sequence). In other embodiments, a high-k dielectric material having a dielectric constant of about 5.0 or greater is used as the gate dielectric 24. Suitable high-k materials include $HfO_2$, $HfSiO_x$, $Al_2O_3$, $ZrO_2$, $ZrSiO_x$, $Ta_2O_5$, $La_2O_3$, nitrides thereof, $HfAlO_x$, $HfAlO_xN_{1-x-y}$, $ZrAlO_x$, $ZrAlO_xN_y$, $SiAlO_x$, $SiAlO_xN_{1-x-y}$, $HfSiAlO_x$, $HfSiAlO_xN_y$, $ZrSiAlO_x$, $ZrSiAlO_xN_y$, combinations thereof, or combinations thereof with $SiO_2$, as examples. As implied above, the gate dielectric 14 may comprise a single layer of material, or alternatively, the gate dielectric 14 may comprise two or more layers.

The gate dielectric 14 may be deposited by chemical vapor deposition (CVD), atomic layer deposition (ALD), metal organic chemical vapor deposition (MOCVD), physical vapor deposition (PVD), or jet vapor deposition (JVD), as examples. In other embodiments, the gate dielectric 14 may be deposited using other suitable deposition techniques. The gate dielectric 14 preferably comprises a thickness of about 10 Å to about 60 Å in one embodiment, although alternatively, the gate dielectric 14 may comprise other dimensions.

The gate electrode 60 is formed over the gate dielectric 14. The gate electrode 60 preferably comprises a semiconductor material, such as polysilicon or amorphous silicon, although alternatively, other semiconductor materials, metals, metal nitrides, metal oxides or metal oxynitrides may be used for the gate electrode 60. The gate electrode 60 having a thickness of between about 400 Å to 2000 Å may be deposited using CVD, PVD, ALD, or other deposition techniques.

P-channel and n-channel transistors preferably include gate electrodes 60 formed from the same layers. If the gate electrodes 60 include a semiconductor, the semiconductor can be doped differently for the p-channel transistors and the n-channel transistors. In other embodiments, different types of transistors can include gates of different materials and/or thicknesses.

The gate layer (and optionally the gate dielectric layer) is patterned and etched using known photolithography techniques to create the gate electrode 60 of the proper pattern. After formation of the gate electrode 60, a thin layer of first spacers 27 is formed. The first spacers 27 are formed from an insulating material such as an oxide and/or a nitride, and can be formed on the sidewalls of the gate electrode 60. The first spacers 27 are typically formed by the deposition of a conformal layer followed by an anisotropic etch. The process can be repeated for multiple layers, as desired. In some cases, if the gate electrode 60 is polysilicon, the thin first spacers 27 may be formed by poly oxidation. The structure at this stage of the process is illustrated in FIG. 5a.

FIG. 5b shows the device after forming the source/drain spacers (second spacers 26) for forming source/drain regions 19. The source/drain extension regions can be implanted using this structure (the gate electrode 26 and the thin first spacer 27 illustrated in FIG. 5a) as a mask. Other implants (e.g., pocket implants, halo implants or double diffused regions) can also be performed as desired. The extension implants also define the channel region 18. If a p-type transistor is to be formed, a p-type ion implant along with an n-type halo implant is used to form the source/drain extension regions. For example, boron ions can be implanted with a dose of about $1\times10^{14}$ cm$^{-2}$ to about $3\times10^{15}$ cm$^{-2}$ at an implant energy between about 0.1 keV to about 1 keV. In other embodiments, other materials such as $BF_2$, or cluster boron, can be implanted. In some cases, the n-type halo implant is arsenic with a dose of about $1\times10^{13}$ cm$^{-2}$ to about $2\times10^{14}$ cm$^{-2}$ at an implant energy between about 10 keV to about 100 keV. If an n-type transistor is to be formed, an n-type ion implant along with a p-type halo implant is used to form the extension regions. In the preferred embodiment, arsenic ions are implanted into the extension regions. For example, arsenic ions can be implanted with a dose of about $1\times10^{14}$ cm$^{-2}$ to about $3\times10^{15}$ cm$^{-2}$ and an implant energy between about 0.5 keV and about 5 keV. In other embodiments, other materials, such as P and Sb can be implanted. In some cases, the p-type halo implant is boron with a dose of about $1\times10^{13}$ cm$^{-2}$ to about $2\times10^{14}$ cm$^{-2}$ at an implant energy between about 1 keV and about 10 keV. In some embodiments, the extension implants can also contain additional implants such as for amorphization or reducing diffusion. Some examples of such implants include silicon, germanium, fluorine, carbon, nitrogen, and/or combinations thereof. Source/drain spacers (second spacers 26) are formed on the sidewalls of the existing thin first spacers 27. FIG. 5b illustrates the devices at this stage of the fabrication process.

Figure 5C:
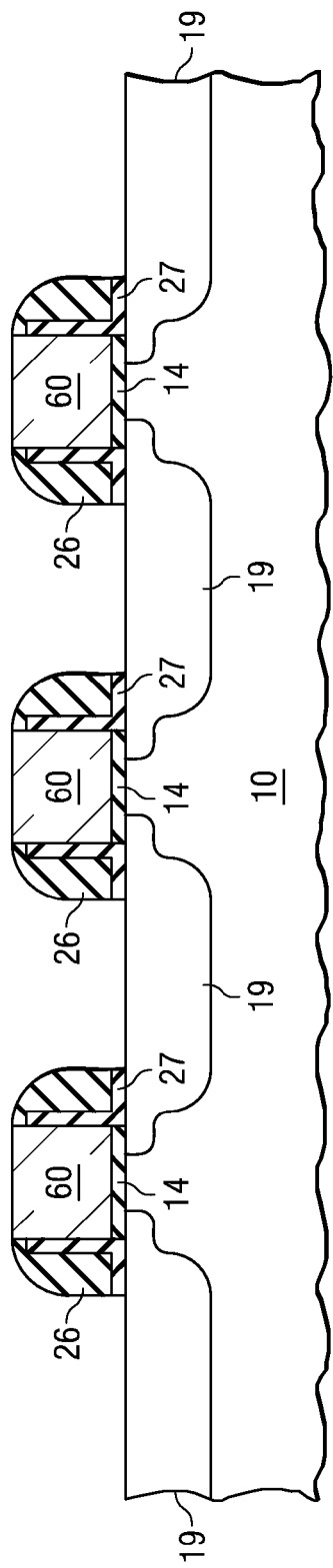
FIG. 5, which includes
FIGS. 5a-5o, illustrates a method for fabrication of a semiconductor chip in various stages of processing, in accordance with embodiments of the invention.
Figure 6:
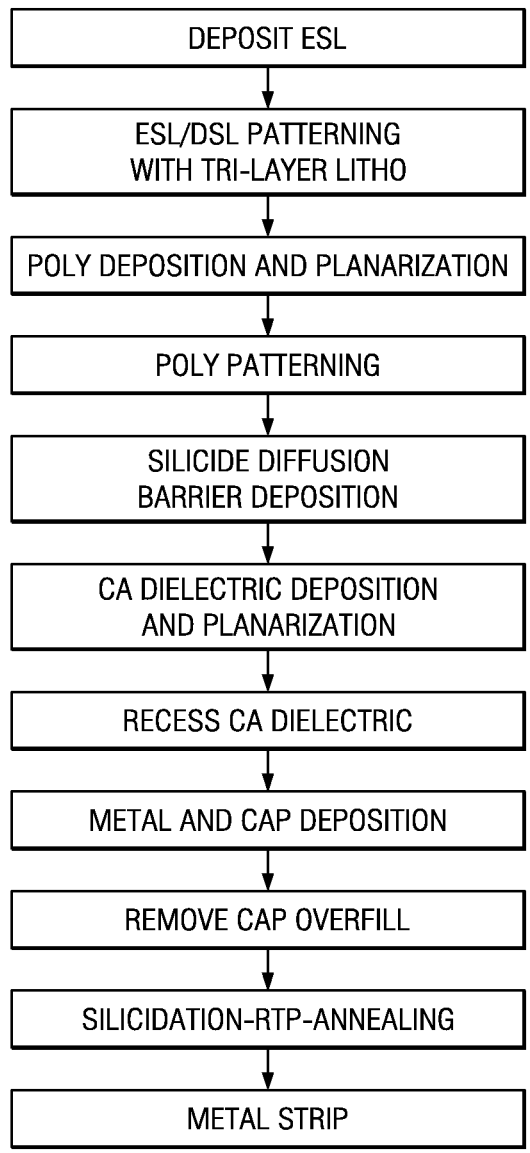
FIG. 6 illustrates a flow chart for formation of the wafer illustrated in FIG. 5, in accordance with embodiments of the invention.

FIG. 5c shows the device after it has been exposed to an ion implant step and rapid thermal anneal which forms the source/drain regions 19. Similar to the formation of the extension regions, if a p-type transistor is to be formed, a p-type ion implant is used to form the heavily doped deep source/drain regions. For example, boron ions can be implanted with a dose of about $1\times10^{15}$ cm$^{-2}$ to about $3\times10^{15}$ cm$^{-2}$ at an implant energy between about 1 keV and about 5 keV. In other embodiments, other materials, such as $BF_2$, molecular boron, or cluster boron can be implanted. If an n-type transistor is to be formed, an n-type ion implant is used to form the heavily doped source/drain regions. In the preferred embodiment, arsenic ions are implanted into the source/drain regions. For example, arsenic ions can be implanted with a dose of about $1\times10^{15}$ cm$^{-2}$ to about $5\times10^{15}$ cm$^{-2}$ and an implant energy between about 5 keV and about 30 keV. In other embodiments, other materials, such as P and Sb can be implanted. In some embodiments, fluorine, carbon, nitrogen, silicon, germanium or combinations of these materials are co-implanted along with the source drain implants. A source/drain anneal follows the source/drain implants and forms the active junctions.

Figure 5D:
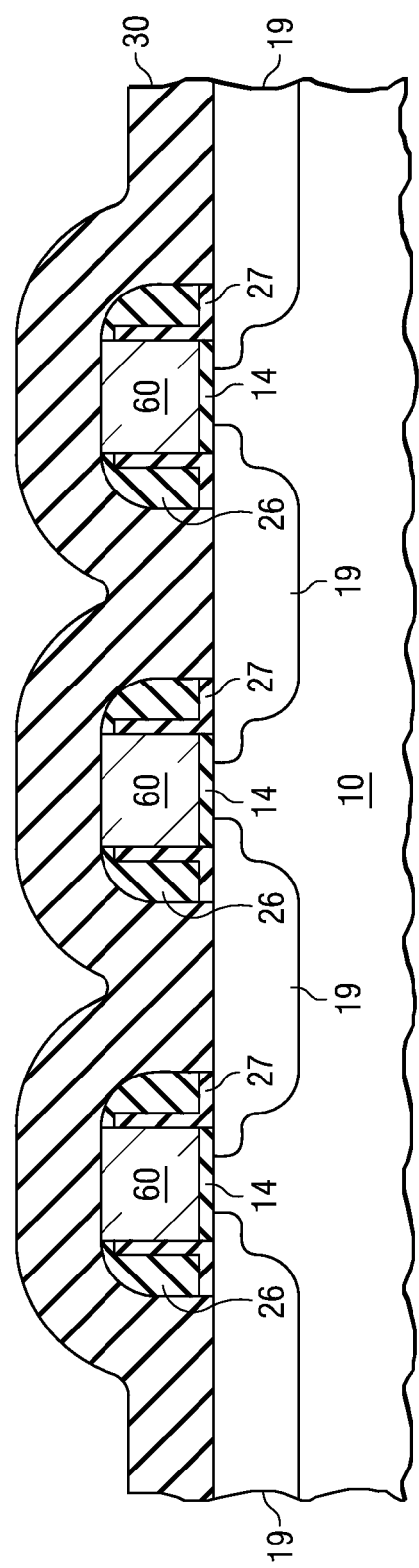

In FIG. 5d, a etch stop liner 30 is deposited over the top surface of the wafer. The etch stop liner 30 is preferably a stress-inducing liner. In one particular example, the etch stop liner 30 is a stress inducing contact etch stop layer (CESL). For example, a nitride film (e.g., silicon nitride) is deposited in such a way as to induce a stress in the underlying semiconductor body 10. The etch stop liner 30 may be deposited in a single step or in multiple steps and may consist of either a single material or a stack of different materials. In the preferred embodiment, the etch stop liner 30 is a silicon nitride film which creates a tensile stress in lateral direction (current flow direction) and a compressive stress in vertical direction on the channel region 18. However, in other embodiments the etch stop liner 30 may have lateral compressive stress or no stress. In some embodiments, the source/drain spacers (second spacers 26) may be either partially or fully removed to enable the formation of a thicker etch stop liner 30 and hence transfer more stress to the channel region 18. The etch stop liner 30 is a blanket film across the semiconductor body 10, however, in some instances, it may also be selectively removed from some of the devices.

Figure 5E:
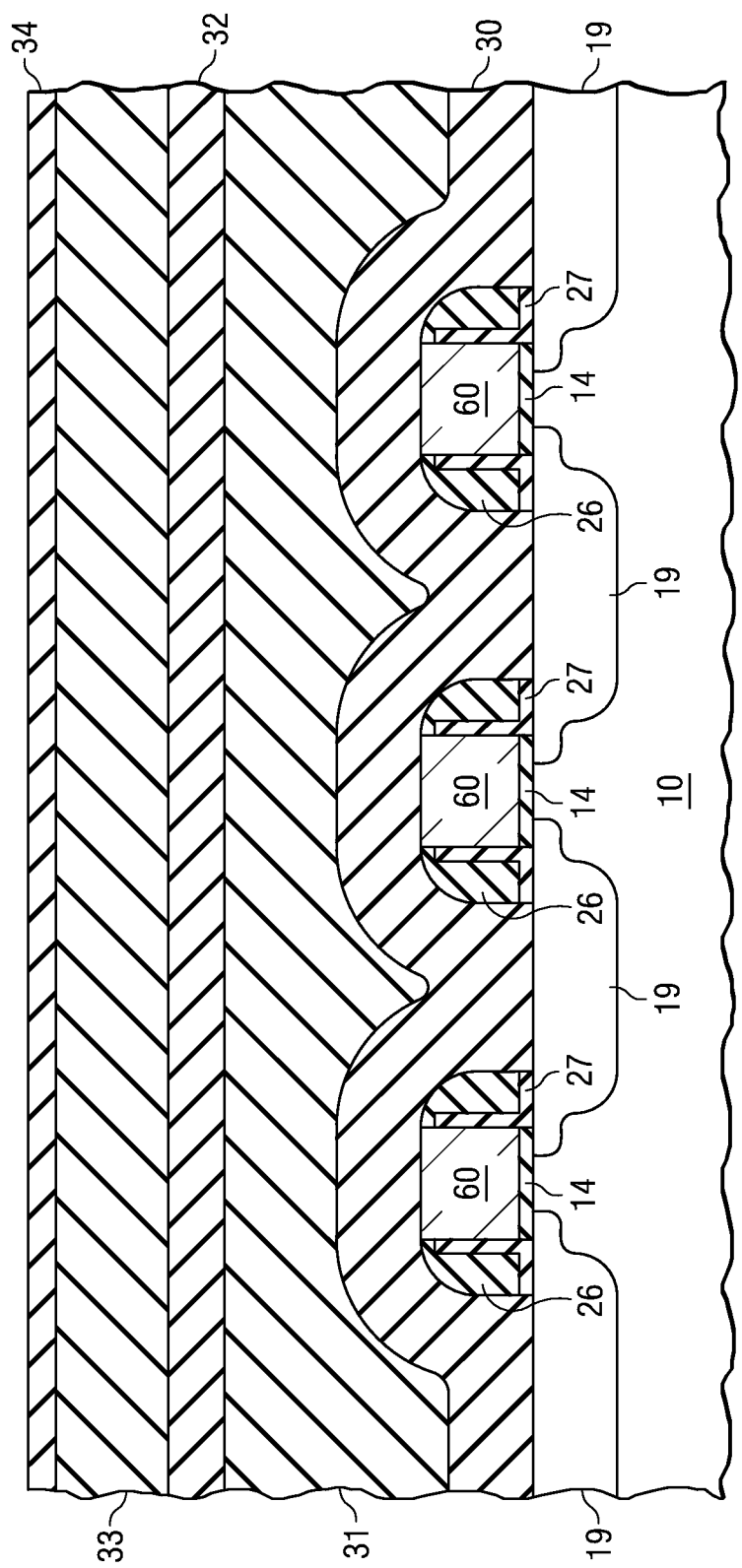

In FIG. 5e, a tri-layer resist stack is formed covering the wafer in order to achieve a successful pattern transfer and superior reflectivity control by effectively lowering substrate reflectivity through the full-range of incident angles with high NA lithography. The tri-layer resist stack comprises three layers: a bottom resist layer 31 over the etch stop liner 30, a middle resist layer 32 and a top resist layer 33 on top of a middle resist layer 32. For example, the top resist layer 33 may be a patternable resist. The middle resist layer 32 may, for example, be a material such as a anti-reflective coating (ARC) with high silicon content (Si BARC Si content >30 wt %). The Si BARC material typically comprises a $SiO_xC_y$ ($N_y$) type compound, although other suitable anti-reflective material may be used in case certain etch selectivity requirements are met. The ARC is used to block reflected radiation from the underlying layers. The reflected radiation from these underlying layers may result in additional interference patterns and result in line width variations in the top resist layer 33 exposed to radiation. The bottom resist layer 31 may be a hard baked organic dielectric layer (ODL). The top layer 33 functions as mask for etching the middle layer 32 which functions, besides its role as reflection suppressant, as the masking material for etching the comparatively thicker bottom resist layer 31. A top ARC layer 34 is formed over the top layer 33. The formation of the resist layer may include bakes or anneals after deposition of each layer.

Figure 5F:
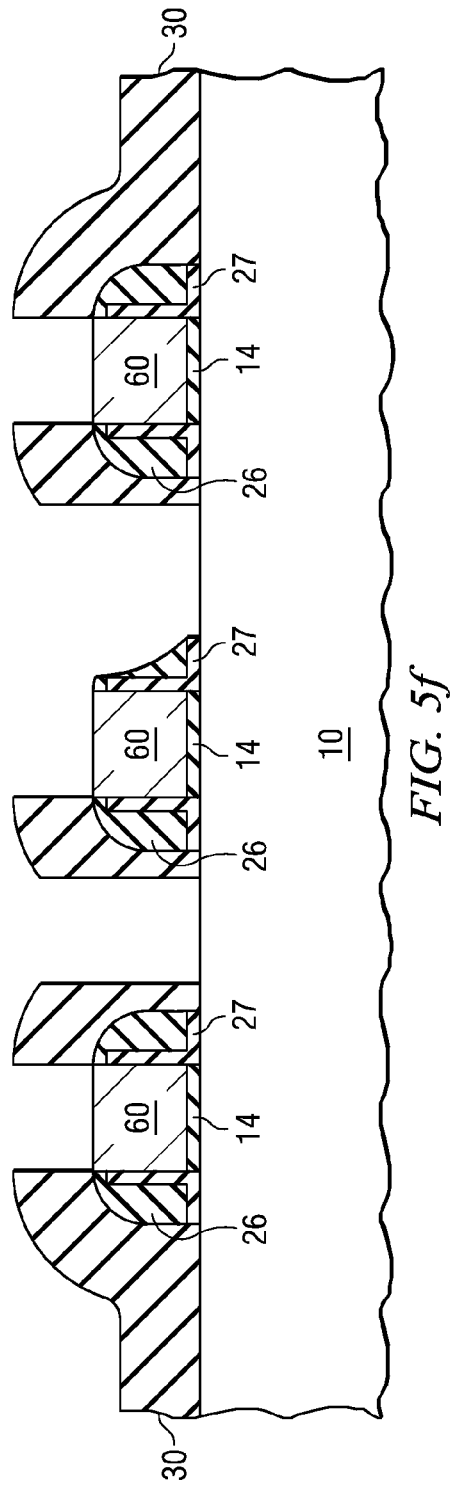

Referring now to FIG. 5f, contact holes are formed using the tri-layer resist layer. The top resist layer 33 is exposed to radiation and developed, using standard lithography techniques. The middle resist layer 32 and bottom resist layer 31 of the tri-layer system are etched employing the top resist layer 33 as a mask, using for example a reactive ion etch. The RIE gas chemistry may comprise $CF_4/CH_2F_2/CHF_3$ for etching the intermediate resist layer 202, and $O_2/CO$, $O_2/CO_2$ or $O_2$/Ar mixtures for etching the bottom resist layer 31. In other embodiments, this gas chemistry may, however, comprise other suitable etchants. The RIE etch uncovers a portion of the etch stop liner 30 through an opening created by the previous etch. A different RIE etches the etch stop liner 30 exposing a portion of the gate electrode 60 and source/drain regions 19. The exposed regions comprising contact holes for making electrical connections to the gate electrode 60 and the source/drain regions 19. However, in some embodiments, the etch chemistry is likely to be different from the previous case due to the different resist stack. As before, the etch chemistry is selected to minimize unwanted etching of other open regions (or optimizes selectivity). The thin top and middle resist layers 33 and 32 may be completely removed by these RIE etches. Any remaining resist of the tri-layer resist is removed, as illustrated in FIG. 5f.

Figure 5G:
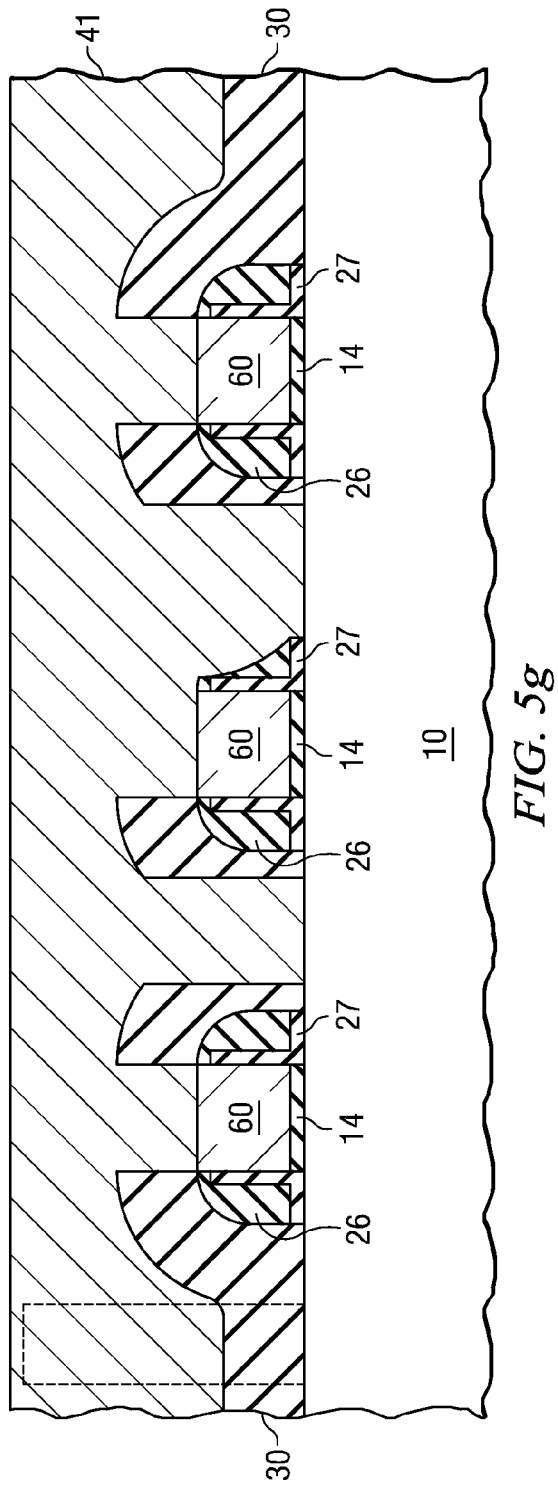

As illustrated in FIG. 5g, a polysilicon layer 41 is deposited over the wafer and planarized. The polysilicon layer 41 contacts the gate electrode 60 and the source/drain regions 19 through the contact holes formed during the previous etch process. The polysilicon layer is planarized using, for example, a chemical mechanical polishing process. In different embodiments, polysilicon germanium may be deposited instead of polysilicon layer 41.

Referring next to FIG. 5h, the polysilicon layer 41 is patterned using a hard mask layer as a mask. First, a hard mask layer is deposited. The hard mask can be an oxide layer or any other suitable organic or inorganic material. The hard mask layer is patterned by using a mask (for example, a tri-layer soft mask described above) for forming the contact plugs in a lithography system. The exposed regions are etched to form the patterned hard mask layer. Using the patterned hard mask layer as a mask, the underlying poly is patterned using a RIE process. The RIE etch chemistry is selected to maximize poly etch removal rate while maintaining anisotropy as well as minimize etching of the etch stop liner 30. The poly RIE typically comprises a etch chemistry comprising CF4/H2, CHF3, HBr, and preferably HBr for etching polysilicon. An over etch is used following a main etch to remove poly stringers that may remain and cause subsequent shorting of unwanted devices.

As illustrated in FIG. 5i, a silicide diffusion barrier 42 is next deposited over the etch stop liner 30 and the polysilicon layer 41. The silicide diffusion barrier 42 in different embodiments, prevents the silicide metal from diffusing into the ILD 40, in case the ILD 40 is composed of a low-k material or SOG. In one embodiment the silicide diffusion barrier 42 comprises a high density plasma nitride (HDP nitride), although in other embodiments, other nitrides or oxides may be used. In case the ILD 40 is composed of silicon oxide or nitride, a diffusion barrier 42 is not required.

Figure 5J:
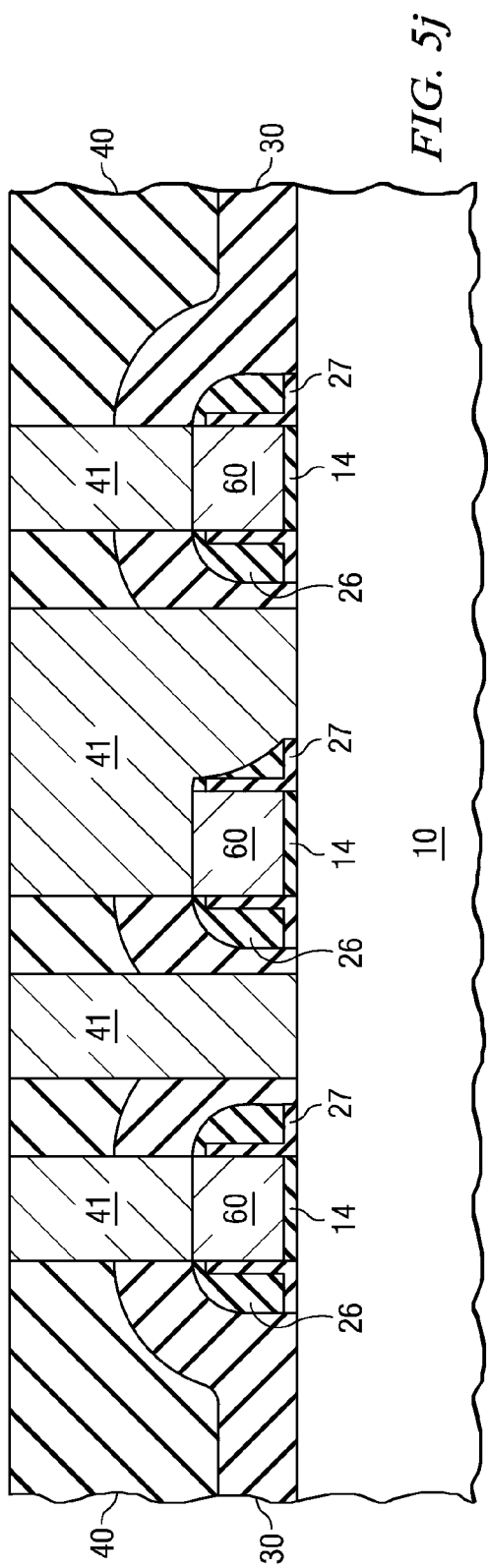

Referring to FIG. 5j, an interlayer dielectric (ILD) layer 40 is then formed over the silicide diffusion barrier 42. Suitable ILD layers include materials such as doped glass (BPSG, PSG, BSG), organo silicate glass (OSG), fluorinated silicate glass (FSG), spun-on-glass (SOG), silicon nitride, and plasma enhanced tetraethyloxysilane (TEOS).

Figure 5K:
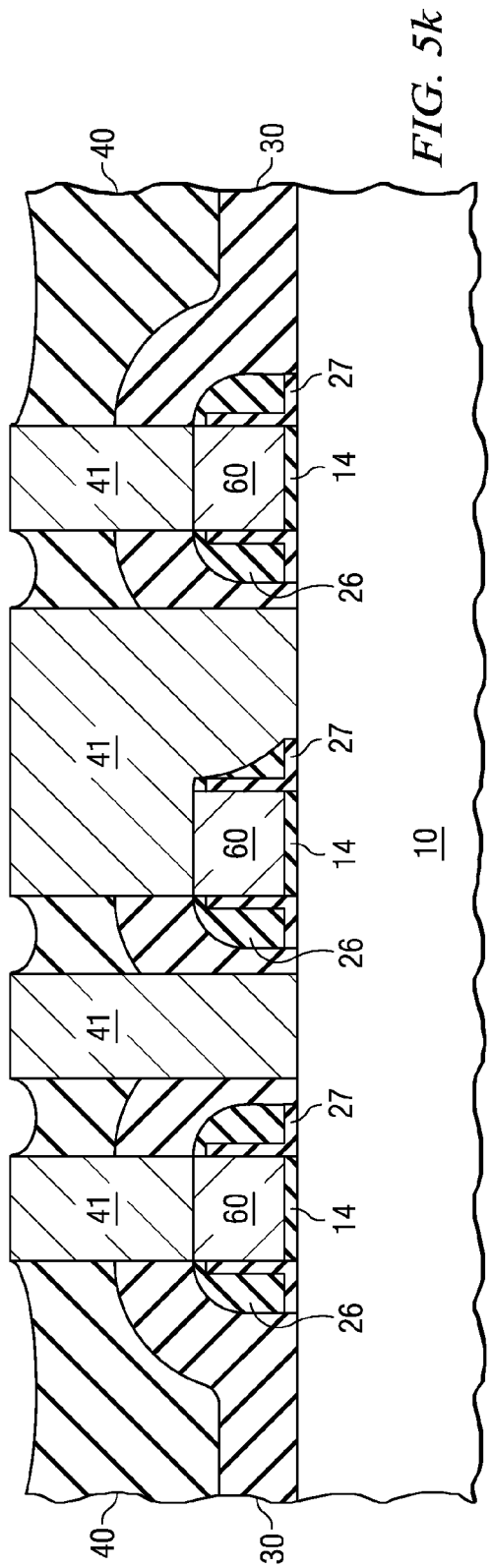

In case the chosen ILD 40 material possesses a high etch rate compared to silicon dioxide or silicon nitride, it is recommended to implement a cap layer on top of the ILD 40 between the contact plugs in order to prevent etch attack during the removal of the metallic films later on in the process flow. As illustrated in FIG. 5k, a recess is formed in the ILD 40 using a etching process that selectively etches ILD without etching the polysilicon region. Examples of the etch process include a dry etch, as with a $NF_3$ chemistry, as well wet etching. Other etch chemistries with good selectivity relative to polysilicon include $CF_4/H_2$, $CHF_3/O_2$ and $C_2F_6$. Next, referring to FIG. 5l, the recess is filled with cap liner 50. The cap liner 50 comprises a nitride, although other suitable materials may be used. The cap liner 50 and the recess may be skipped if the ILD 40 comprises a nitride or a silicon dioxide. A planarisation to remove the overfill follows deposition of cap liner 50. The planarisation process comprises, for example, a CMP technique or a timed wet etch process, e.g., a hot phosphorous bath.

Referring next to FIG. 5m, a first metallic film 51 and a first metal liner 52 are deposited. The first metallic film 51 preferably comprises nickel, or nickel platinum. The first metal liner 52 protects the first metallic film 51 from oxidation during subsequent annealing. In a preferred embodiment of the present invention, the first metal liner 52 comprises titanium nitride.

As illustrated in FIG. 5n, the gate plugs 70, source/drain electrodes 80 and silicide regions 90 are formed. A rapid thermal anneal is followed to anneal the first metallic film 51. During the rapid anneal, first metal atoms (e.g., nickel and platinum atoms) from the first metallic film 51 diffuse into the polysilicon layer 41 and subsequently react with the polysilicon material. For example, if the first metal comprises Ni, the Ni atoms react with polysilicon forming $NiSi_2$, NiSi, and $Ni_2Si$. The thickness of the first metallic film 51 and the thermal budget of the rapid thermal anneals are controlled to form the least resistive phase. For example, in case of Ni, the preferred phase in NiSi. In the preferred embodiment, the first metallic film 51 comprises a silicide forming metal. In various embodiments, the first metallic film 51 is nickel platinum, but could also be nickel, cobalt, copper, molybdenum, titanium, tantalum, tungsten, ytterbium, erbium, zirconium, platinum, or combinations thereof. The rapid thermal anneal preferably comprises a drive-in step at a lower temperature followed by a reaction step at a higher temperature, although other anneals are performed. For example, in one embodiment, a first anneal at about 350° C. to about 450° C. for about 1 to about 90 seconds and followed by a second anneal at about 450° C. to about 500° C. for about 1 to about 5 minutes. During the rapid thermal anneal, the polysilicon layer 41 is silicided. The exposed part of the source/drain regions 19 also react with the filled silicide metal to form a single layer of silicide region 90. The silicide region 90 over the source/drain regions 19 are thus formed during this step. The silicidation process results in the formation of the gate electrode 60, gate plugs 70, source/drain electrodes 80 all comprising a silicide material. As the gate electrode 60 is silicided beginning from under the gate plugs 70, the distance between the gate plugs is controlled or optimized to minimize variations in the gate silicide composition. As next illustrated in FIG. 5o, the first metal liner 52 and any remaining first metallic film 51 are removed. In a preferred embodiment of the present invention, the first metal liner 52 and any remaining first metallic film 51 are removed by a wet etch process. As a specific example, an Aqua Regia ($HNO_3$+3 HCl) bath is applied for about 5 minutes to about 15 minutes at about 30° C. to about 50° C. to dissolve any nobel contents in the metal alloy from the first metallic film 51.

Further processing continues as in a typical integrated chip manufacturing process. For example, the next metallization level is formed comprising metal lines and vias for connecting the gate plugs 70 and source/drain plugs to other devices. Metallization layers that interconnect the various components are also included in the chip, but are not illustrated herein for the purpose of simplicity.

A method of fabrication of the structure will now be described using FIG. 7 and the flow chart of FIG. 8, in accordance with an embodiment of the invention, wherein FIGS. 7a-7d illustrate cross sectional views of a portion of the wafer during the fabrication process.

In this embodiment, the gate electrode 60 comprises a first metal. The first metal is selected to comprise a material that is a diffusion barrier to the diffusion of the silicide metal. Hence, the work function and other properties of the first metal are not impacted by the presence of the silicide metal. In this embodiment, the locations of the contact holes over the gate electrode, as well as the time of the silicide process can be independently controlled. For example, the time of the silicidation process is selected to ensure complete silicidation of the longer source/drain electrodes 80, as well as for forming a source/drain silicide region 90. As the gate electrode 60 is not impacted during the anneal, the silicidation anneal time (and temperature of anneals) can be independently selected.

Figure 7C:
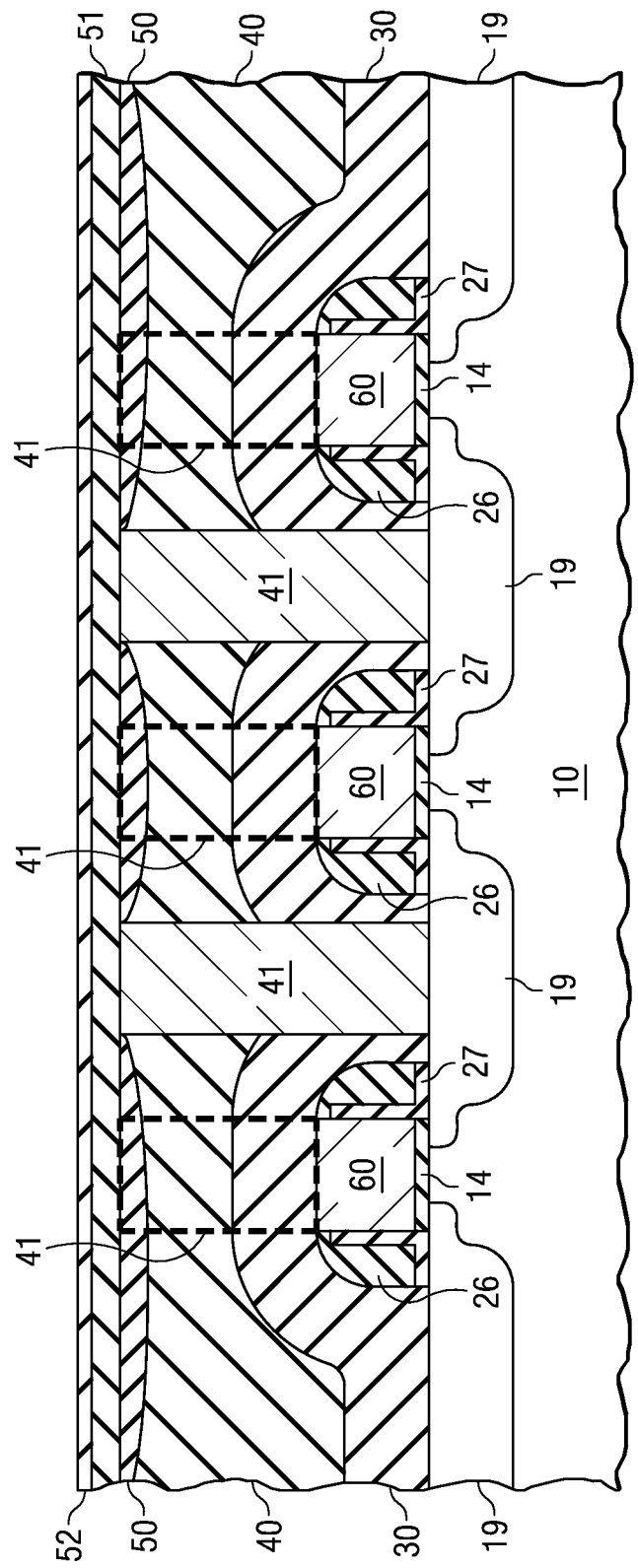
Figure 7D:
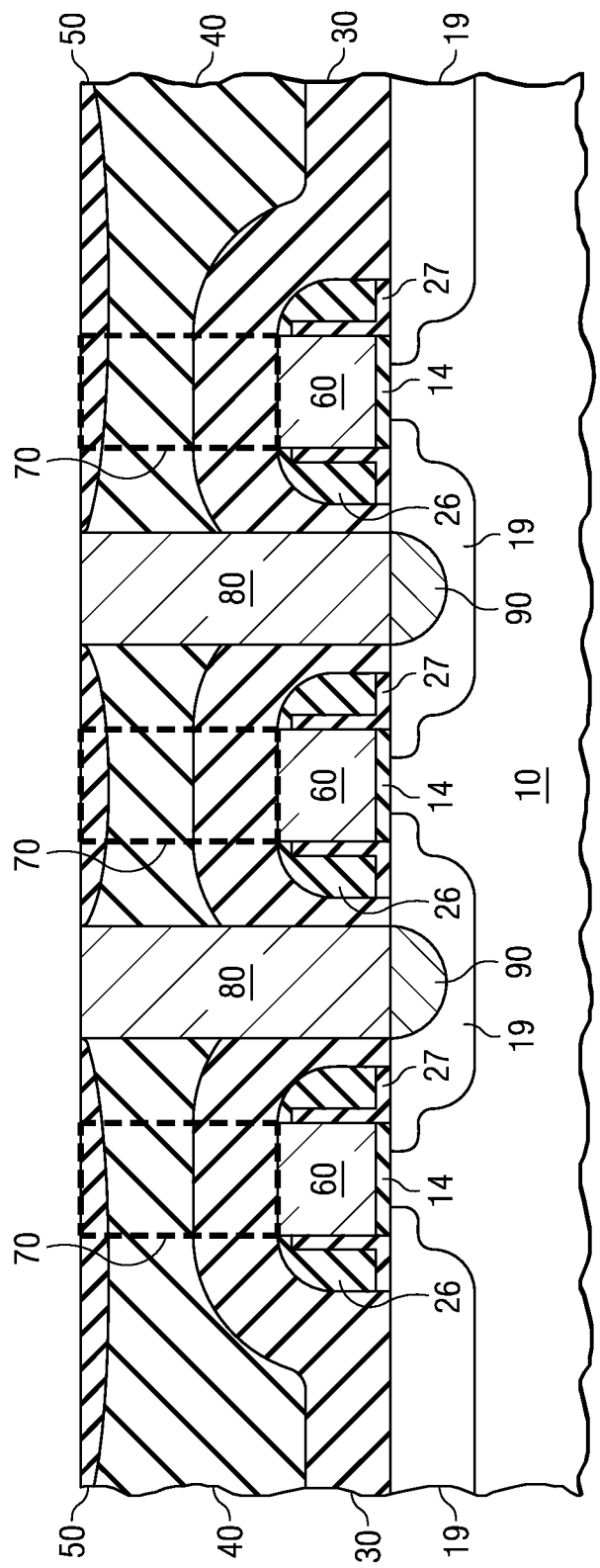
Figure 8:
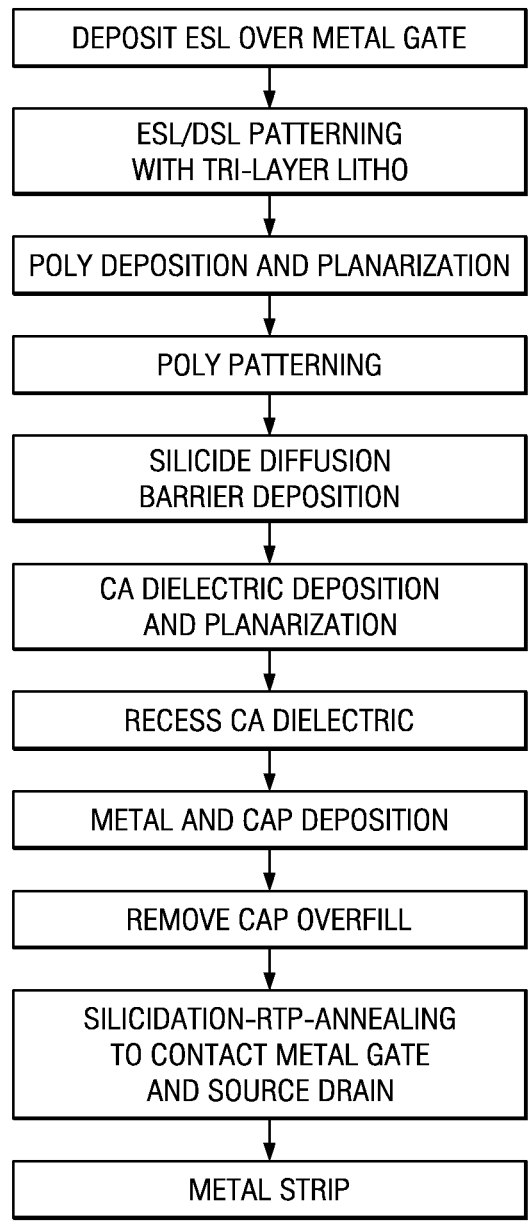
FIG. 8 illustrates a flow chart for formation of the wafer as illustrated in FIG. 7, in accordance with embodiments of the invention.

Referring now to FIG. 7a, the channel region 18, source/drain regions 19, first and second spacers 26 and 27 are first formed as described in FIGS. 5a-5c. The etch stop liner 30 is patterned using a tri-layer resist stack. The patterned etch stop liner 30 comprises contact holes for forming the contacts to the gate electrode 60 and the source drain electrodes. In this embodiment, the gate contacts may be placed at any suitable location irrespective of the process. As next illustrated in FIG. 7c, a polysilicon layer 41 is deposited and fills the contact holes. A first metallic film 51 and a first metal liner 52 are deposited. The first metallic film 51 preferably comprises nickel, or nickel platinum. In various embodiments, the first metallic film 51 comprises suitable diffusion sources, for example, titanium, tungsten or combinations thereof. In some embodiments, the first metallic film 51 may comprise other suitable metals, examples include cobalt, copper, molybdenum, tantalum, ytterbium, erbium, zirconium, platinum, or combinations thereof. The first metal liner 52 protects the first metallic film 51 during subsequent annealing from oxidation. As illustrated in FIG. 7d, the gate plugs 70, source/drain electrodes 80 and silicide regions 90 are formed during a rapid thermal anneal. Unlike the previous embodiment, the silicide metal (metal from the first metallic film 51) does not interact or diffuse through the gate electrode 60. The first metal liner 52 and any remaining first metallic film 51 are subsequently removed.

A method of fabrication of the structure will now be described using FIG. 9 and the flow chart of FIG. 10, in accordance with an embodiment of the invention, wherein FIGS. 9a-9d illustrate cross sectional views of a portion of the wafer during the fabrication process.

In this embodiment, a gate electrode 60 comprising a first conductive material 61 and a third conductive material 63 are first patterned and processed as described in FIG. 5a. The third conductive material 63 is subsequently replaced and a second conductive material 62 is deposited. Thus, the second conductive material 62 is disposed above the first conductive material 61 forming the gate structure. The second conductive material 62 is selected to prevent in-diffusion of the silicide metal while forming the gate contact plugs. The second conductive material 62 in some embodiments also diffuses into the first conductive material and changes the electrical behavior (such as work function) of the first conductive material.

Referring to FIG. 9a, the channel region 18, source/drain regions 19, first and second spacers 26 and 27 are first formed as described in FIGS. 5a-5c. The gate stack comprises the first conductive material 61 and a third conductive material 63. A planarizing layer 65, such as a spin on glass layer, is deposited over the wafer and planarized as shown in FIG. 9b. The planarization exposes the third conductive material 63. The third conductive material 63 is selectively etched exposing the first conductive material 61 (FIG. 9c). A second conductive material 62 is deposited and planarized (FIG. 9d). An optional fourth conductive material 64 may be deposited disposed between the first and the second conductive materials 61 and 62. The planarizing layer 65 is removed by etching.

An etch stop liner 30 is deposited over the wafer (FIG. 9f). Referring to FIG. 9g, the etch stop liner 30 is patterned using a tri-layer resist. The patterned etch stop liner 30 comprises contact holes for forming the contacts to the gate electrode 60 and the source drain electrodes. In this embodiment, the gate contacts may be placed at any suitable location irrespective of the process.

Figure 9I:
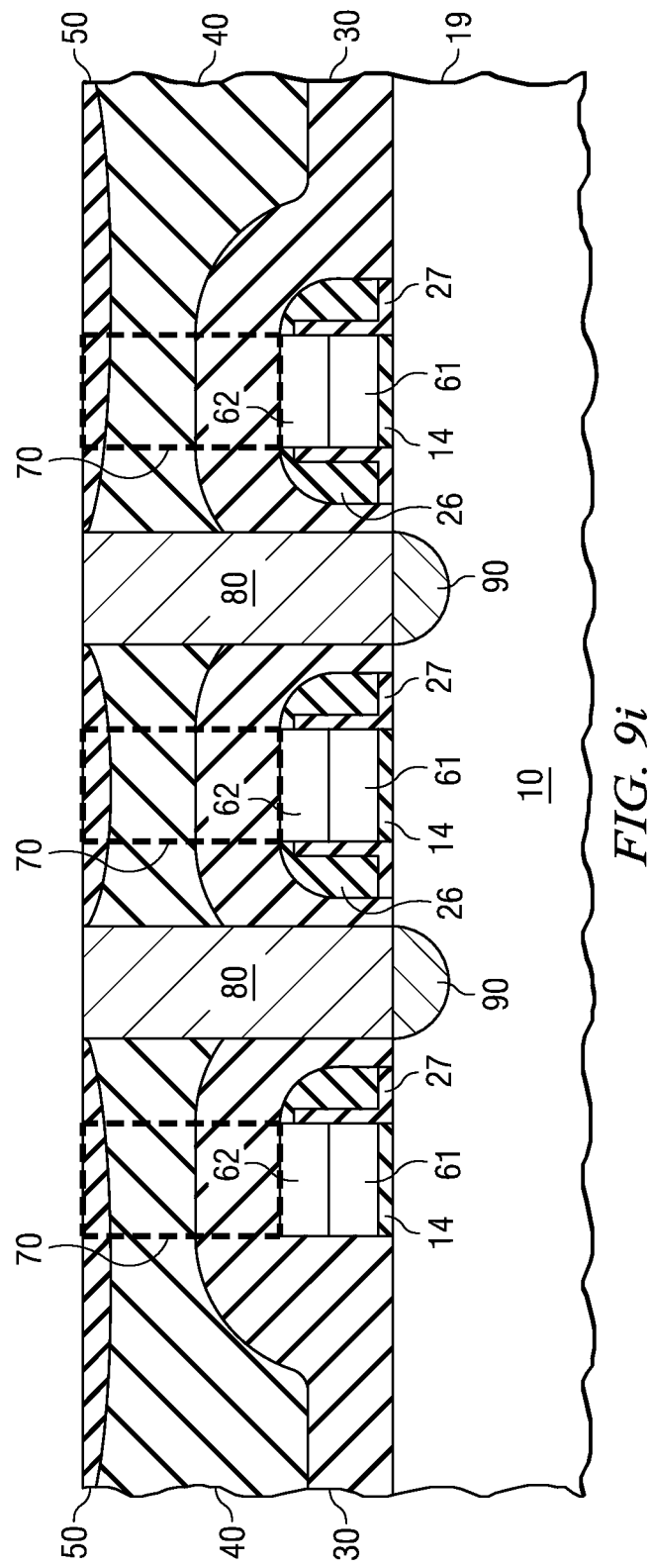
Figure 10:
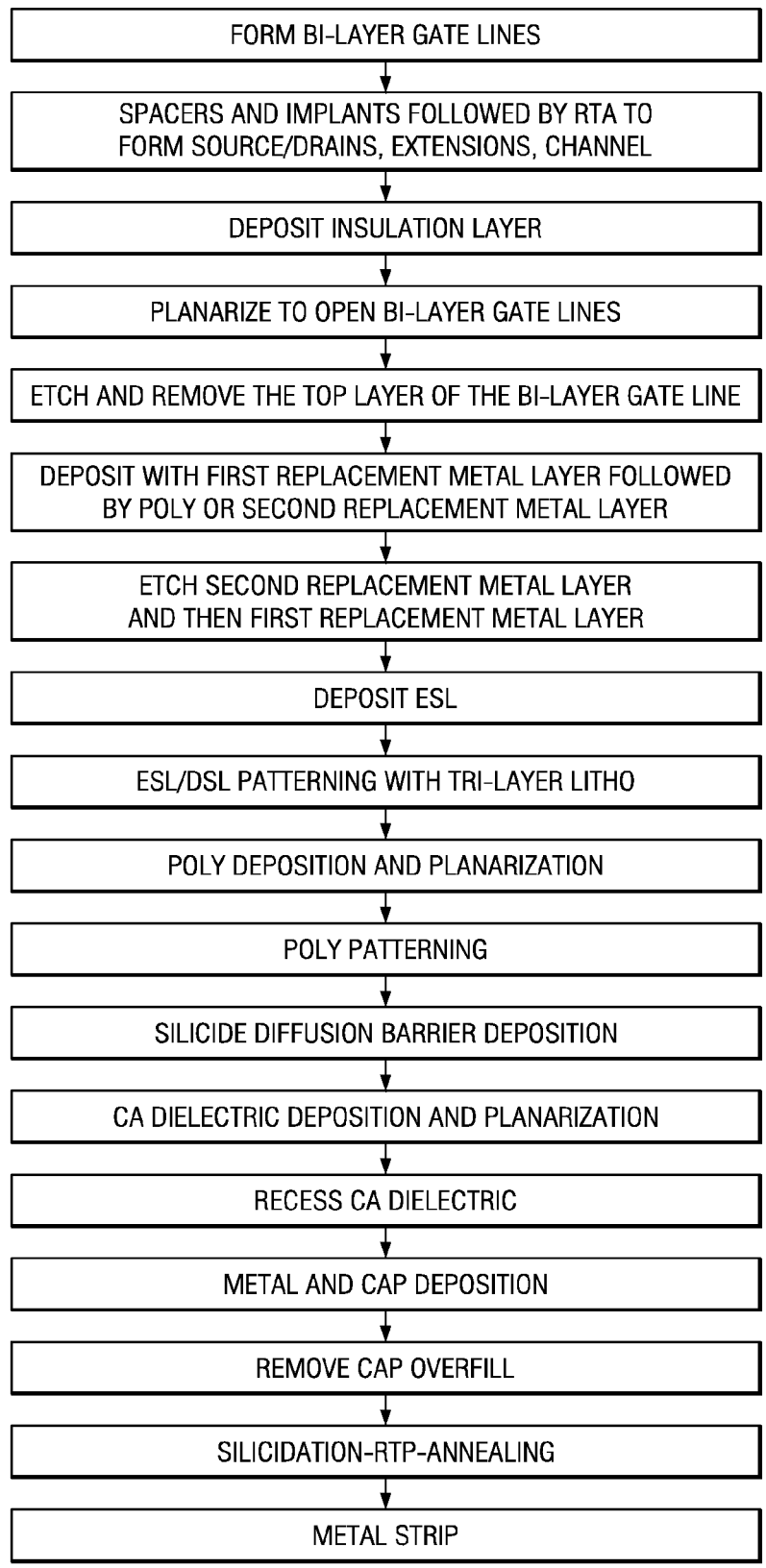
FIG. 10, illustrates a flow chart for formation of the wafer illustrated in FIG. 9, in accordance with embodiments of the invention.

As next illustrated in FIG. 9h, a polysilicon layer 41 is deposited and fills the contact holes. A first metallic film 51 and a first metal liner 52 are deposited. The first metallic film 51 preferably comprises nickel, or nickel platinum. As illustrated in FIG. 9i, the gate plugs 70, source/drain electrodes 80 and silicide regions 90 are formed during a rapid thermal anneal. Unlike the previous embodiment, the silicide metal (metal from the first metallic film 51) does not interact or diffuse through the gate electrode 60. In one embodiment, the work function of the gate electrode is defined by the in-diffusion of atoms from the fourth conductive material 64. For example, the first conductive material 61 comprises polysilicon and the fourth conductive material 64 comprises a silicide metal e.g., NiPt, and the second conductive material 62 comprises a silicide metal diffusion barrier material such as TiN. Hence, during the silicide anneal (anneal that forms the gate plugs 70 and source/drain electrodes 80) the silicide metal diffuses into the first conductive material 61 and forms the gate electrode. In an alternate example, the first conductive material 61 comprises a metal nitride such as TiN and the fourth conductive material 64 comprises an impurity that dopes the metal nitride, and the second conductive material 62 comprises polysilicon. In some embodiments, the second conductive material 62 comprises a diffusion barrier material to the atoms from the first metallic film 51. Examples of materials that may be used in various embodiments as diffusion barrier for nickel or nickel-platinum include rhenium, titanium, cobalt, tungsten, tantalum, tantalum nitride, or titanium nitride. Hence, during the silicide anneal, the silicide metal converts the second conductive material 62 into a metal silicide. Hence, the gate plugs 70 contact the first conductive material 61. In this embodiment, the formation of the gate dielectric/gate electrode interface which defines the gate work function, and the formation of source/drain electrodes 80 and source/drain regions 90 are decoupled.

Figure 11A:
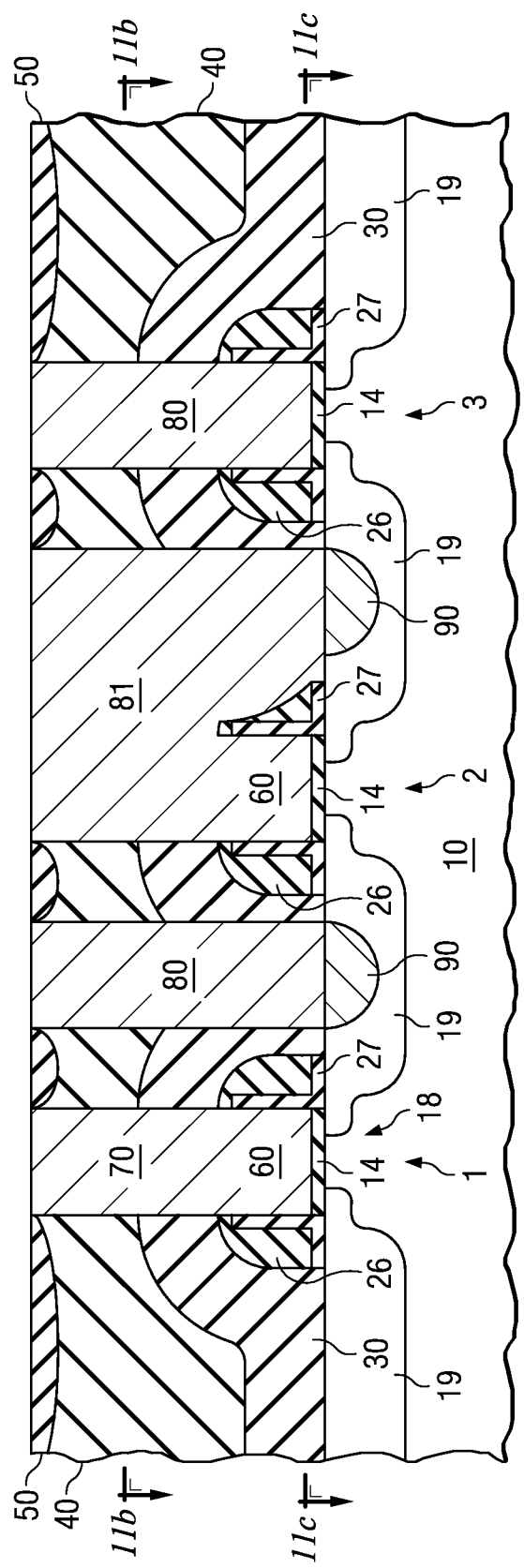
Figure 11B:
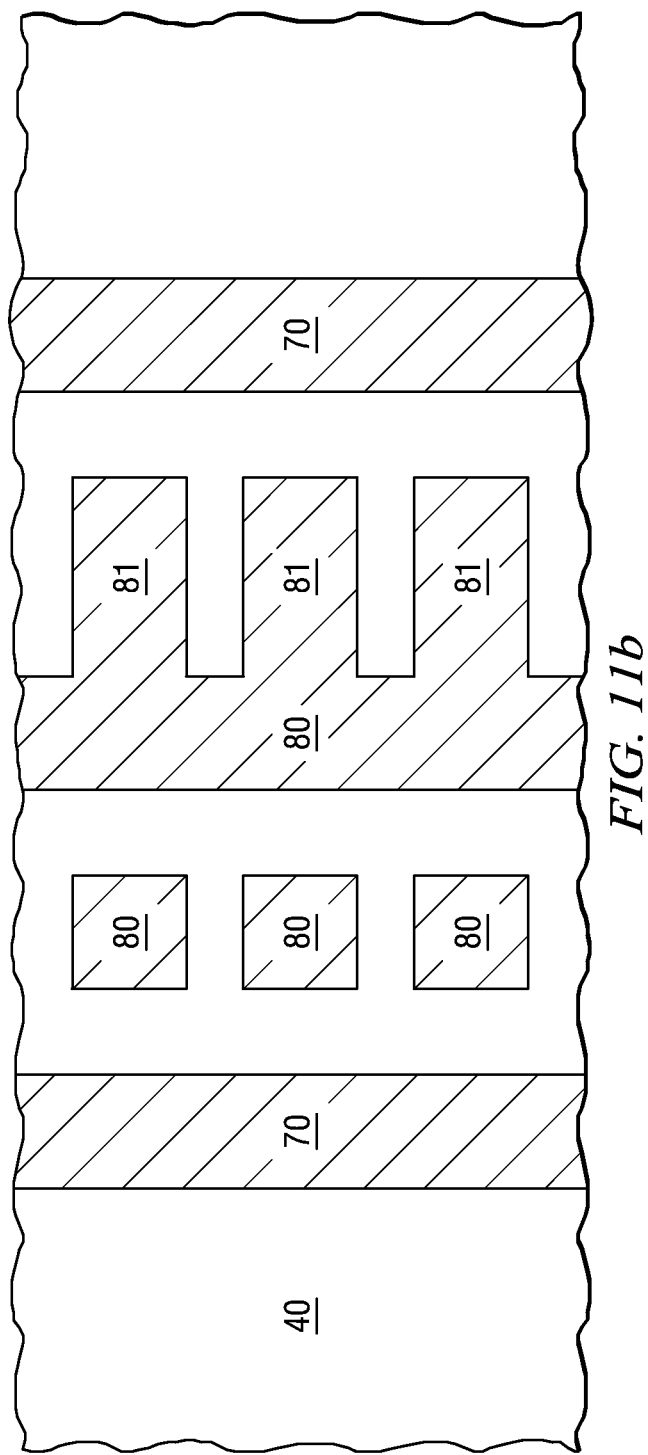
Figure 11C:
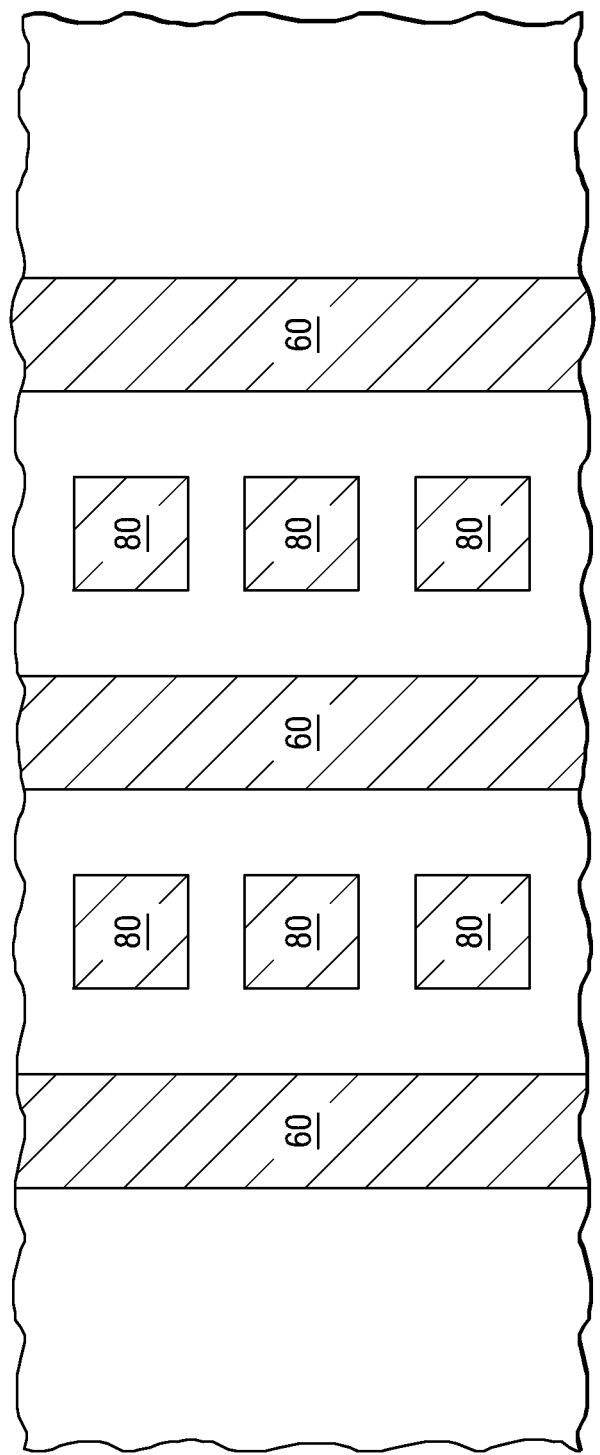

An embodiment of the invention is illustrated in FIG. 11 which includes FIG. 11a-11c. FIG. 11 illustrates a device fabricated in accordance with an embodiment of the present invention. The gate electrodes 60, the gate plugs 70 connecting the gate electrode 60, the source/drain electrodes 80 connecting the source/drain regions 19, and the silicide regions 90 underlying the source/drain electrodes 80 comprise a metal silicide.

In this embodiment, gate plugs 70 comprise the same structure as the underlying gate electrode 60. In other words, the gate plugs 70 are a vertical extension of the gate electrodes 60 towards the ILD 40 surface. This is advantageously formed using various embodiments, as the metal silicide is formed during the same step for both the gate electrodes 60 and the gate plugs 70. Using this process reduces complexity in forming the gate electrodes 60 and gate plugs 70 and to minimize variations in silicide across the device width (or gate line) of the transistors. Further, the contact bar 81 may also be similarly formed as shown in FIG. 11b.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
an active area disposed in a semiconductor body;
an electrode disposed over the active area;
a liner disposed over the electrode and the active area;
an insulating layer disposed over the liner;
a first contact plug disposed in the insulating layer and the liner, the first contact plug disposed above and in contact with a portion of the active area, the first contact plug comprises a first conductive material;
a second contact plug disposed in the insulating layer and the liner, the second contact plug disposed above and in contact with a portion of the electrode, the second contact plug comprises the first conductive material;
a contact material layer disposed in the active area, the contact material layer disposed under the first contact plug, wherein the contact material layer comprises the first conductive material, wherein the electrode comprises the first conductive material;
a recess disposed in the insulating layer between the first contact plug and the second contact plug; and
a cap liner disposed within recess over the insulating layer.

2. The semiconductor device of claim 1, wherein the first conductive material comprises materials selected from the group consisting of nickel silicide, platinum silicide, nickel germanide, platinum germanide, yerbium silicide, yerbium germanide, erbium silicide, erbium germanide, cobalt silicide, titanium silicide, tantalum silicide, molybdenum, tungsten and combinations thereof.

3. The semiconductor device of claim 1, wherein a thickness of the contact material layer is between about 50 Å and about 300 Å.

4. The semiconductor device of claim 1, wherein the contact material layer comprises a silicide or a silico-germanide.

5. The semiconductor device of claim 1, wherein the electrode comprises a second conductive material disposed over the active area and a third conductive material disposed over the second conductive material.

6. The semiconductor device of claim 5, wherein the second conductive material comprises polysilicon and the third conductive material comprises a silicide diffusion barrier material.

7. The semiconductor device of claim 5, wherein the second conductive material comprises a silicide diffusion barrier material and the third conductive material comprises polysilicon.

8. The semiconductor device of claim 5, wherein the electrode comprises a fourth conductive material disposed between the second conductive material and the third conductive material.

9. The semiconductor device of claim 8, wherein the third conductive material comprises a silicide diffusion barrier material.

10. The semiconductor device of claim 1, wherein the cap liner disposed between the first contact plug and the second contact plug has a convex bottom surface.

11. The semiconductor device of claim 1, wherein the first conductive material comprises a metal silicide.

12. A semiconductor device comprising:
an active area disposed in a semiconductor body;
an electrode disposed over the active area;
a liner disposed over the electrode and the active area;
an insulating layer disposed over the liner;
a first contact plug disposed in the insulating layer and the liner, the first contact plug disposed above and in contact with a portion of the active area, the first contact plug comprises a first conductive material;
a second contact plug disposed in the insulating layer and the liner, the second contact plug disposed above and in contact with a portion of the electrode, the second contact plug comprises the first conductive material; and
a contact material layer disposed in the active area, the contact material layer disposed under the first contact plug, wherein the contact material layer comprises the first conductive material, wherein the first conductive material is a silicide, and wherein the electrode underlying the second contact plug is fully silicided.

13. The semiconductor device of claim 12, wherein the first conductive material comprises materials selected from the group consisting of nickel silicide, platinum silicide, nickel germanide, platinum germanide, yerbium silicide, yerbium germanide, erbium silicide, erbium germanide, cobalt silicide, titanium silicide, tantalum silicide, molybdenum, tungsten and combinations thereof.

14. The semiconductor device of claim 12, wherein a thickness of the contact material layer is between about 50 Å and about 300 Å.

15. The semiconductor device of claim 12, wherein the contact material layer comprises a silicide or a silico-germanide.

16. A semiconductor device comprising:
an active area disposed in a semiconductor body;
an electrode disposed over the active area;
a liner disposed over the electrode and the active area;
an insulating layer disposed over the liner;
a first contact plug disposed in the insulating layer and the liner, the first contact plug disposed above and in contact with a portion of the active area, the first contact plug comprises a first conductive material;
a second contact plug disposed in the insulating layer and the liner, the second contact plug disposed above and in contact with a portion of the electrode, the second contact plug comprises the first conductive material; and
a contact material layer disposed in the active area, the contact material layer disposed under the first contact plug, wherein the contact material layer comprises the first conductive material, and wherein the first contact plug and the second contact plug are merged together and comprise a single contact bar.

17. The semiconductor device of claim 16, wherein the first conductive material is a metal silicide.

18. The semiconductor device of claim 16, wherein the single contact bar comprises an integrated metal silicide bar.

19. A semiconductor device comprising:
an active area disposed in a semiconductor body;
a shallow trench isolation region surrounding the active area;
a gate formed over a portion of the active area;
source/drain regions formed in the active area adjacent to the gate;
a liner disposed over the gate, the active area adjacent to the gate, and at least a part of the shallow trench isolation region;
an insulating layer disposed over the liner;
a silicide diffusion barrier disposed over the liner, wherein the insulating layer is disposed over the silicide diffusion barrier;
a first contact plug disposed in the insulating layer and the liner, the first contact plug exposing a portion of active area adjacent to the gate, the first contact plug comprises a first conductive material;
a contact material disposed in the active area, the contact material formed under the first contact plug, the contact material comprising the first conductive material, wherein the first conductive material comprises a metal silicide; and
a second contact plug disposed in the insulating layer and the liner, the second contact plug exposing a portion of the gate, the second contact plug comprising the first conductive material, wherein the gate underlying the second contact plug comprises the first conductive material.

20. The semiconductor device of claim 19, wherein the gate comprises a second conductive material disposed over the active area and a third conductive material disposed over the second conductive material.

21. The semiconductor device of claim 19, further comprising:
a plurality of recesses in the insulating layer, each of the recess of the plurality of recesses having a concave surface; and
a plurality of cap liners disposed within each of the plurality of recesses over the insulating layer, wherein a cap liner of the plurality of cap liners is disposed between the first contact plug and the second contact plug.

22. A semiconductor device comprising:
an active area disposed in a semiconductor body;
a shallow trench isolation region surrounding the active area;
a gate formed over a portion of the active area;
source/drain regions formed in the active area adjacent to the gate;
a liner disposed over the gate, the active area adjacent to the gate, and at least a part of the shallow trench isolation region;
an insulating layer disposed over the liner;
a first contact plug disposed in the insulating layer and the liner, the first contact plug exposing a portion of active area adjacent to the gate, the first contact plug comprises a first conductive material;
a contact material disposed in the active area, the contact material formed under the first contact plug, the contact material comprising the first conductive material, wherein the first conductive material comprises a metal silicide; and
a second contact plug disposed in the insulating layer and the liner, the second contact plug exposing a portion of the gate, the second contact plug comprising the first conductive material, wherein the second contact plug and the gate are self-aligned and wherein the second contact plug comprises a same shape as the gate.

23. The semiconductor device of claim 22, wherein the contact material comprises a germanide.

24. A semiconductor device comprising:
an active area disposed in a semiconductor body;
an electrode disposed over the active area, wherein the electrode comprises a first conductive material, a second conductive material, a third conductive material disposed over the second conductive material, and a fourth conductive material disposed between the second conductive material and the third conductive material;
a liner disposed over the electrode and the active area;
an insulating layer disposed over the liner;
a first contact plug disposed in the insulating layer and the liner, the first contact plug disposed above and in contact with a portion of the active area, the first contact plug comprises the first conductive material;
a second contact plug disposed in the insulating layer and the liner, the second contact plug disposed above and in contact with a portion of the electrode, the second contact plug comprises the first conductive material; and
a contact material layer disposed in the active area, the contact material layer disposed under the first contact plug, wherein the contact material layer comprises the first conductive material.

25. The semiconductor device of claim 24, wherein the third conductive material comprises a silicide diffusion barrier material.

26. A semiconductor device comprising:
an active area disposed in a semiconductor body;
an electrode disposed over the active area;
a liner disposed over the electrode and the active area;
an insulating layer disposed over the liner;
a first contact plug disposed in the insulating layer and the liner, the first contact plug disposed above and in contact with a portion of the active area, the first contact plug comprises a first conductive material;
a second contact plug disposed in the insulating layer and the liner, the second contact plug disposed above and in contact with a portion of the electrode, the second contact plug comprises the first conductive material;
a contact material layer disposed in the active area, the contact material layer disposed under the first contact plug, wherein the contact material layer comprises the first conductive material, wherein the electrode comprises the first conductive material;
a plurality of recesses in the insulating layer;
a cap liner disposed within each of the plurality of recesses over the insulating layer; and
a silicide diffusion barrier over the liner, wherein the insulating layer is disposed over the silicide diffusion barrier.

* * * * *